US008742989B2

(12) United States Patent
Bohn et al.

(10) Patent No.: US 8,742,989 B2
(45) Date of Patent: Jun. 3, 2014

(54) INTEGRATED 3-DIMENSIONAL ELECTROMAGNETIC ELEMENT ARRAYS

(75) Inventors: Florian Bohn, Campbell, CA (US); Seyed Ali Hajimiri, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 184 days.

(21) Appl. No.: 13/118,188

(22) Filed: May 27, 2011

(65) Prior Publication Data

US 2012/0105182 A1 May 3, 2012

Related U.S. Application Data

(60) Provisional application No. 61/349,148, filed on May 27, 2010.

(51) Int. Cl.
*H01Q 1/38* (2006.01)
(52) U.S. Cl.
USPC ................... 343/700 MS; 343/848
(58) Field of Classification Search
USPC .................. 343/700 MS, 848, 893, 754
See application file for complete search history.

(56) References Cited

U.S. PATENT DOCUMENTS

| | | | |
|---|---|---|---|
| 8,120,537 B2 * | 2/2012 | del Rio et al. .......... | 343/700 MS |
| 2003/0201944 A1 * | 10/2003 | Aikawa et al. ................ | 343/770 |
| 2008/0094296 A1 * | 4/2008 | Lee ................................ | 343/754 |
| 2010/0052994 A1 * | 3/2010 | Llorens del Rio et al. ... | 343/700 MS |
| 2010/0265009 A1 * | 10/2010 | Horng et al. ................... | 333/185 |

OTHER PUBLICATIONS

Babakhani et al., "Finding Globally Optimum Solutions in Antenna Optimization Problems", IEEE Antennas and Propagation Society International Symposium, 2010, 4 pgs.
Hajimiri, "mm-Wave Silicon ICs: an Opportunity for Holistic Design", IEEE Radio Frequency Integrated Circuits Symposium, 2008, pp. 357-360.
Lavaei et al., "Passively Controllable Smart Antennas", IEEE Global Communications Conference, 2010, 6 pgs.

* cited by examiner

*Primary Examiner* — Thien M Le
(74) *Attorney, Agent, or Firm* — KPPB LLP

(57) ABSTRACT

Systems and methods for constructing integrated three dimensional electromagnetic element arrays using a bulk resonator are illustrated. In several embodiments, the integrated three dimensional electromagnetic element arrays include electromagnetic elements buried within the bulk resonator. In many embodiments, inclusion of a third dimension in the electromagnetic element array can alleviate or eliminate the trade-offs that are experienced in conventional integrated antennas by using the third physical dimension to provide an additional degree of freedom to manipulate electromagnetic boundary conditions in the near-field of the substrate, affecting both the resulting electromagnetic near- and far-fields. In several embodiments, three dimensional electromagnetic element arrays are formed by mechanically stacking substrates on which integrated planar circuits are formed (i.e. chips) using conventional die stacking techniques.

27 Claims, 19 Drawing Sheets

INTEGRATED 3-DIMENSIONAL ELECTROMAGNETIC ELEMENT ARRAYS

CROSS-REFERENCE TO RELATED APPLICATION

The present application claims priority to U.S. Provisional Application Ser. No. 61/349,148 entitled "Programmable Electromagnetic Near- and Far-Field Manipulation" and filed May 27, 2010, the disclosure of which is incorporated by reference herein in its entirety.

FIELD OF THE INVENTION

The present invention generally relates to integrated antennas and more specifically to integrated 3-dimensional electromagnetic element arrays.

BACKGROUND

The trend towards smaller available feature sizes in integrated circuit processes enables systems and circuits operating at ever higher frequencies. As a result, research and commercial interests are moving towards circuits and systems operating in the millimeter- and sub-millimeter wave regions using standard integrated circuit technologies to provide less expensive and mass-producible solutions compared to discrete designs.

Advances in packaging and thin film technologies allow the integration of several integrated circuit dies or components, possibly from different technologies or processes, into integrated systems offering solutions in small form factors. Examples of such systems include integration of processing units with cache memory integrated circuit dies in a stacked configuration for thin form factor packages, or integration of RF input or output amplification stages with off-chip surface acoustic wave filters on a ceramic substrate.

Among others, current areas of interest include radio circuits and systems, sensors, continuous and pulsed power sources, imaging systems and spectroscopic equipment operating at millimeter and sub-millimeter wavelengths, sometimes also referred to as the terahertz or far-infrared regime. In the millimeter-wave region, applications for integrated receiver and transmitter systems include car radar, communications systems and imaging systems for personal and property security among others. In the sub-millimeter wave region, so-called terahertz electronics is actively researched with applications either envisioned or already marketed for terahertz spectroscopy, short-distance communication, and medical and process control imaging among others.

In all of the above cases, it is desirable to migrate, whenever possible, towards commodity technologies (e.g. CMOS versus heterojunction bipolar technologies) and higher levels of integration to reduce costs, increase functionality and potentially open new markets. As part of this drive, it is highly desirable for millimeter- and sub-millimeter systems to integrate as much as possible all components such as transmit and receive antennas and electromagnetic sensors. One of the difficulties encountered is to control the electromagnetic near- and far-fields as the wavelengths become comparable to the physical dimensions of the circuit and electromagnetic energy couples to the bulk and surrounding dielectric (air) or has to be contained to the surface. This, in turn, makes it difficult to implement truly versatile, broad-band and efficient microelectronic circuits in these frequency ranges.

Traditionally, integrated circuits are planar, that is they are formed using process layers on the surface of a semiconductor substrate. The substrate is then packaged using one of many packaging options. In this context, the terms "antenna", "element" or "electromagnetic element" are typically understood to mean any circuit element electromagnetically interacting with the physical environment. FIG. 1A illustrates a typical system package that involves attaching an integrated electromagnetic element to a ground plane. The package 10 includes an integrated electromagnetic element 12 on a substrate 14 with a package ground-plane 16. The substrate connects to external devices via wire bonds 18 and package leads 20. A flip-chip packaging solution is illustrated in FIG. 1B. The flip-chip package 30 also includes an integrated electromagnetic element 32 on a substrate 34 that connects with external devices via solder bumps 36 and ball pins 38. Other packaging implementations are also possible, but all of these share the planar nature of the electromagnetic elements due to the planar nature of semiconductor processing.

In all of the implementations described above, trade-offs can exist because electromagnetic boundary conditions are imposed in a thin, effectively planar region (within the thickness manipulated by the process). In particular, with the antennas and electromagnetic elements constrained to a thin region in space, trade-offs exist with respect to efficiency, versatility and usable range of operation frequencies when attempting to manipulate the electromagnetic environment. Versatility refers to the ability to reconfigure the antenna. An example of a reconfigurable antenna system is a phased array, where electronic reconfiguration achieves directionality. Broad-band operation, meaning that the antenna can operate over a wide range of frequencies is typically desirable, because it allows greater freedom in system design and also lowers the overall risk of malfunction as narrow-band antennas are typically more susceptible to process and environmental changes.

SUMMARY OF THE INVENTION

Three dimensional electromagnetic element arrays in accordance with embodiments of the invention can be configured to manipulate the electromagnetic near-field in a more efficient, versatile and broadband fashion within integrated circuits and systems than has been traditionally possible. Three dimensional electromagnetic element arrays constructed in accordance with embodiments of the invention can benefit any circuit or system that changes electromagnetic near- and far-fields, such as integrated receivers, transmitters, power sources, sensors, imaging or spectroscopic systems, to name a few. In many instances, increasing the efficiency of antennas and/or electromagnetic elements enables the antenna(s) to radiate/receive at low passive loss. More broadly speaking, the ability to control the impedance of an antenna can facilitate interconnection with transmitter(s)/receiver(s).

One embodiment of the invention includes a first planar integrated circuit, where the first planar integrated circuit comprises at least a first integrated electromagnetic element, and at least a second planar integrated circuit located on a different plane to the first planar integrated circuit, where the second planar integrated circuit comprises at least a second integrated electromagnetic element. In addition, the first and second integrated electromagnetic elements are configured to control the near- and far-field pattern produced by the 3-dimensional electromagnetic element array.

In a further embodiment, the first planar integrated circuit is formed on the surface of a bulk resonator, and the second planar integrated circuit is buried within the bulk resonator.

Another embodiment also includes a plurality of planar integrated circuits buried at different depths within the bulk resonator, where each integrated circuit includes at least one integrated electromagnetic element. In addition, the electromagnetic elements are configured to control the near- and far-field pattern produced by the 3-dimensional electromagnetic element array.

In a still further embodiment, electromagnetic elements are configured to control the modes excited within the bulk resonator.

In still another embodiment, the electromagnetic elements are configured to control the directionality of energy radiated by the bulk resonator.

In a yet further embodiment, the electromagnetic elements are configured as an antenna.

In yet another embodiment, the antenna is a phased antenna array.

In a further embodiment again, the electromagnetic elements form part of an electromagnetic reflector.

In another embodiment again, the electromagnetic elements form part of a shutter.

In a further additional embodiment, the electromagnetic elements form part of a pulsed source.

In another additional embodiment, the pulsed source is configured so that the timing of switching between states is aligned with the delay in the 3-dimensional electromagnetic element array.

In a still yet further embodiment, the electromagnetic elements are configured as a frequency selective filter.

In still yet another embodiment, the bulk resonator comprises a die stack, the first planar integrated circuit is located on a first semiconductor substrate within the die stack, and the second planar integrated circuit is located on a second semiconductor substrate within the die stack.

In a still further embodiment again, the first planar integrated circuit is located on the surface of the die stack, and the second integrated circuit is buried within the die stack.

In still another embodiment again, the die stack further comprises intermediate dielectric layers.

In a still further additional embodiment, at least the first semiconductor region includes a region having different material properties to the region on which the first planar integrated circuit is formed.

Still another additional embodiment also includes semiconductor optics formed on the die stack.

In a yet further embodiment again, the electromagnetic elements are configured to control the modes excited within the die stack.

In yet another embodiment again, the electromagnetic elements are configured to control the directionality of the energy radiated by the bulk resonator.

In a yet further additional embodiment, the 3-dimensional electromagnetic element array is configured as an antenna.

In yet another additional embodiment, the antenna is a phased antenna array.

In a further additional embodiment again, the electromagnetic elements form part of an electromagnetic reflector.

In another additional embodiment again, the electromagnetic elements form part of a shutter.

In another further embodiment, the electromagnetic elements form part of a pulsed source.

In still another further embodiment, the pulsed source is configured so that the timing of switching between states is aligned with the delay in the 3-dimensional electromagnetic element array.

In yet another further embodiment, the electromagnetic elements are configured as a frequency selective filter.

In another further embodiment again, the electromagnetic elements are electronically reconfigurable.

In another further additional embodiment, the electromagnetic elements are electronically reconfigurable.

DETAILED DESCRIPTION

Figure 1:
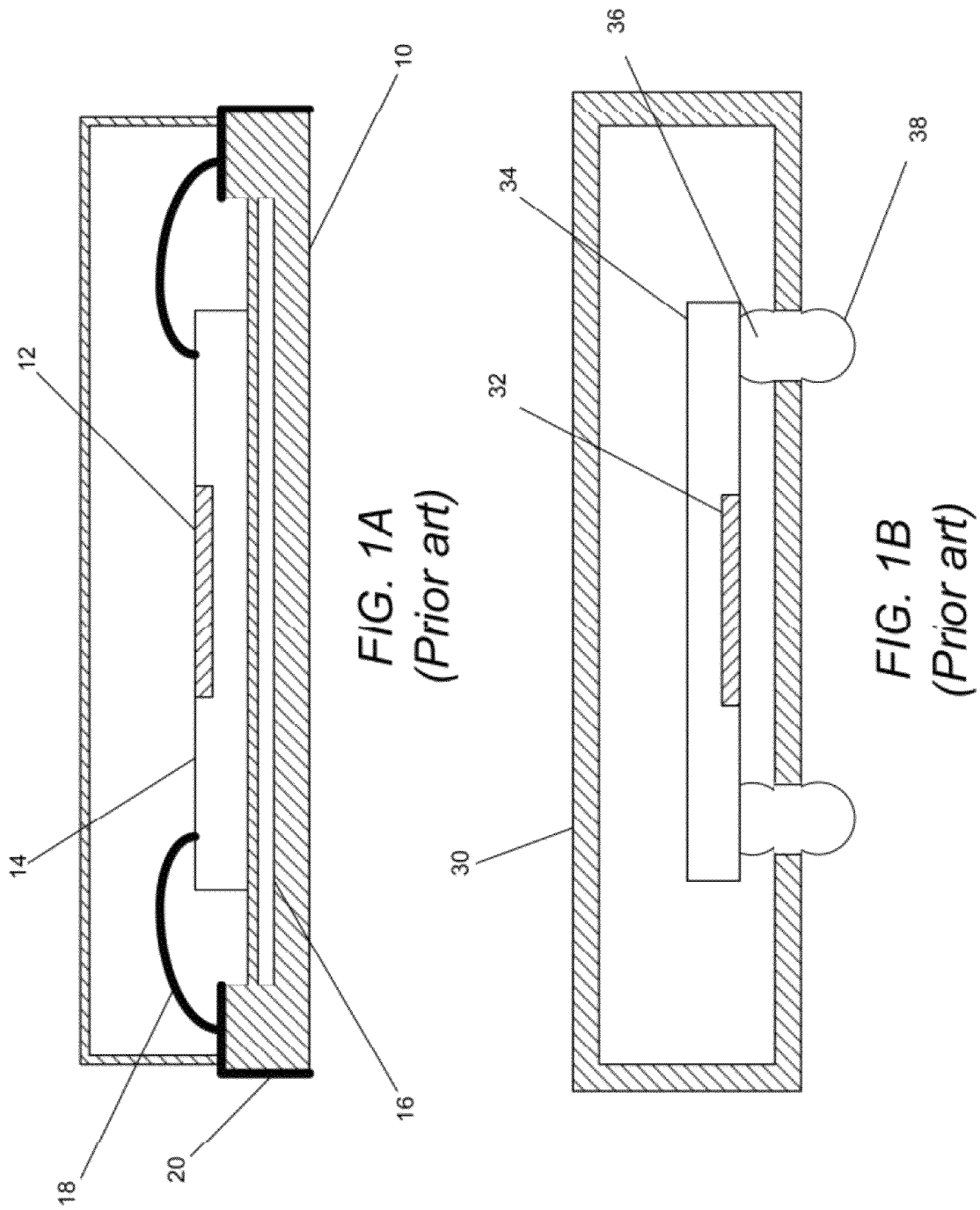
FIG. 1A is a conceptual illustration of a typical system package containing an integrated electromagnetic element mounted on a ground plane.
FIG. 1B is a conceptual illustration of a prior art flip-chip package containing an integrated electromagnetic element.

Turning now to the drawings, systems and methods for constructing integrated three dimensional (3-dimensional) electromagnetic element arrays using a bulk resonator are illustrated. In several embodiments, the integrated 3-dimensional electromagnetic element arrays include electromagnetic elements buried within the bulk resonator. In many embodiments, inclusion of a third dimension in the electromagnetic element array can alleviate or eliminate the trade-offs that are experienced in conventional integrated antennas by using the third physical dimension to provide an additional degree of freedom to manipulate electromagnetic boundary conditions in the near-field of the substrate, affecting both the resulting electromagnetic near- and far-fields. In several embodiments, 3-dimensional electromagnetic element arrays are formed by mechanically stacking substrates on which integrated planar circuits are formed (i.e. chips) using conventional die stacking techniques. In a number of embodiments, the stack of substrates is integrated with optics by using materials other than doped silicon as part of the stack. In addition, since doped semiconductor materials typically have a loss tangent, in a number of embodiments thinned semiconductor dies are stacked on top of intermediate dielectric layers that can have different properties to influence the properties of the bulk resonator. In many embodiments, the intermediate dielectric layers reduce losses without sacrificing the advantages gained by utilizing an integrated 3-dimensional electromagnetic element array. In a number of embodiments, the dielectric layers are regions of different doping and/or permittivity in the semiconductor substrates used to form the die stack.

In applications where a certain electromagnetic field configuration in the near- and/or far-field of the integrated circuit is desired, for example radiation emanating (or arriving) from/to the integrated circuit, a traditional integrated circuit typically can only influence the boundary conditions on the surface of the circuit due to the planar nature of the processing. Moreover, antennas at the surface of the semiconductor excite substrate mode ratios determined by the substrate height, backplane and physical properties of the substrate. As a result, similar elements on the surface excite the same or similar ratios of substrate modes irrespective of their location on the surface. This severely limits the space of achievable electromagnetic field configurations, and directly leads to the trade-offs mentioned above. Where an electromagnetic field configuration is desired at the surface as well as in the bulk of the substrate, employing electromagnetic elements in the third dimension enables additional degrees of freedom in influencing the near- and far-field. In particular, structures buried in the substrate can excite different ratios of substrate modes compared to surface-only structures, effectively adding a dimension of control that is otherwise not obtainable with planar only structures. The construction and performance of integrated 3-dimensional electromagnetic element arrays and their use in a variety of classes of device in accordance with embodiments of the invention are discussed further below.

Integrated 3-Dimensional Electromagnetic Element Arrays

Distributing electromagnetic elements in a three dimensional manner throughout a bulk resonator can improve the efficiency, directivity, and versatility of the antenna. In this way, three dimensional arrays of electromagnetic elements can be utilized to implement various devices including but not limited to transmit and receive antennas, electronically controlled shutters, traps and reflectors (mirrors) for electromagnetic energy, frequency selective filters, and artificial anisotropic materials.

A bulk resonator in which a 3-dimensional array of electromagnetic elements is formed can be constructed using conventional semiconductor processing and die stacking technologies. In addition, the types of electromagnetic elements that can be utilized in these devices is typically not limited other than by the requirements of a specific application. Conceivably, processes can be developed to fabricate semiconductor dies in which 3-dimensional arrays of electromagnetic elements are formed, including 3-dimensional arrays of electromagnetic elements in which electromagnetic elements are buried within the bulk resonator. Utilizing such processes, a single layer bulk resonator can be constructed that includes a 3-dimensional array of electromagnetic elements in accordance with embodiments of the invention. The construction of integrated 3-dimensional electromagnetic element arrays using die stacking techniques in accordance with embodiments of the invention is discussed further below.

Integrated 3-Dimensional Electromagnetic Element Arrays Formed Using Die Stacks

Figure 2:
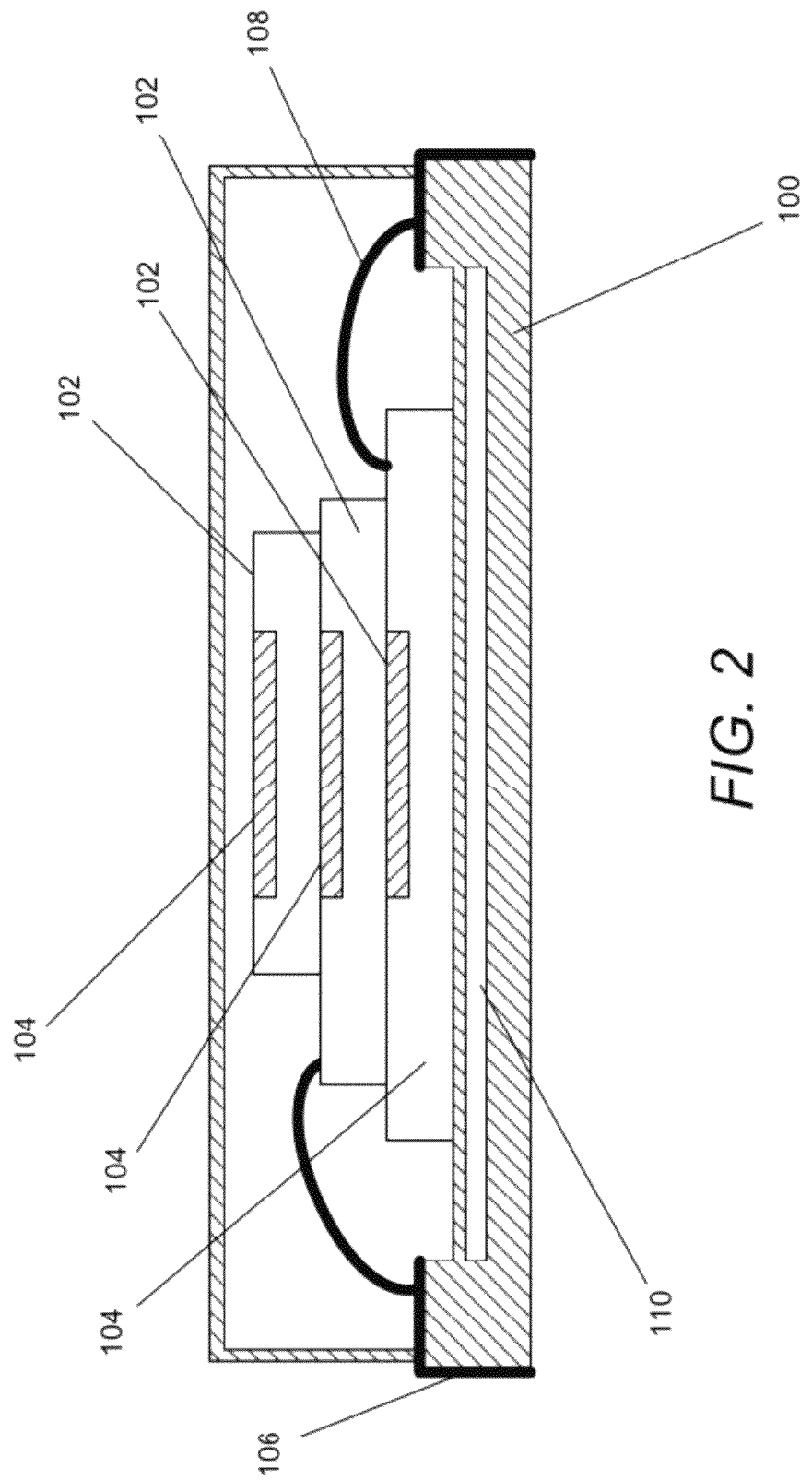
FIG. 2 is a conceptual illustration of a package containing an integrated 3-dimensional electromagnetic element array formed using a die stack in accordance with an embodiment of the invention.

A package containing an integrated 3-dimensional electromagnetic element array formed using a die stack in accordance with an embodiment of the invention is conceptually illustrated in FIG. 2. The package 100 includes a plurality of doped semiconductor dies 102 on which electromagnetic elements 104 are integrated. The doped semiconductor dies are stacked so that the entire stack acts as a single bulk resonator and so that some of the electromagnetic elements are buried in the resulting bulk resonator. The stacked dies are connected to package leads 106 by wire bonds 108. In the illustrated embodiment, the electromagnetic element array is formed by electromagnetic elements formed using three layers of integrated circuits, two of which are buried within the bulk resonator formed by the stacked substrates. The packaging 100 provides a ground plane layer 110. Although a three layer electromagnetic element array is shown in FIG. 2, electromagnetic elements can be located at any number of different depths within a bulk resonator as appropriate to the requirements of a specific application in accordance with embodiments of the invention.

Figure 3A:
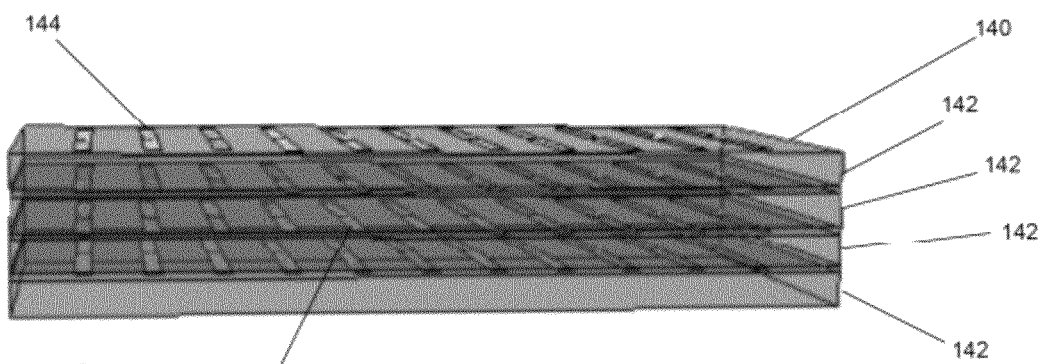
FIGS. 3A and 3B are three dimensional conceptual illustrations of a bulk resonator formed from a die stack of four doped semiconductor substrates on which dipole electromagnetic elements are formed in accordance with embodiments of the invention. Details such as bonding pads and integrated circuitry are omitted for clarity.
Figure 3B:
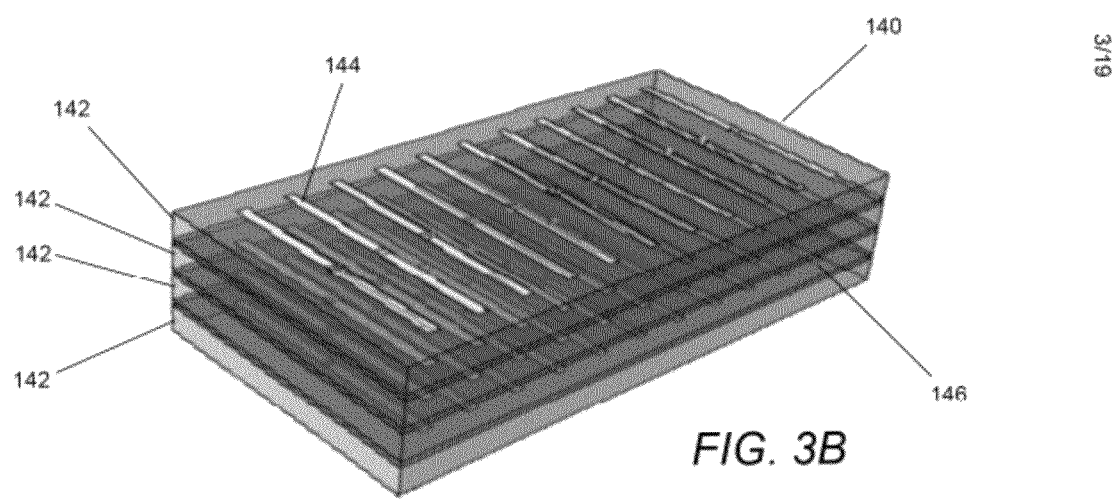

A bulk resonator formed from a die stack including four layers of electromagnetic elements in accordance with embodiments of the invention is illustrated in FIGS. 3A and 3B. In the illustrated embodiment, a bulk resonator 140 is formed from a stack of four doped semiconductor dies 142. Integrated electromagnetic elements are formed on the surface of each die within the die stack. A plurality of dipole-shaped electromagnetic elements is formed on the surface of each die within the die stack. Several of the dipole-shaped electromagnetic elements 144 are on the surface of the bulk resonator 140, and the dipole-shaped electromagnetic elements formed on the surface of the other dies in the die stack are buried within the bulk resonator 140. As is discussed further below, inclusion of electromagnetic elements in a third dimension can provide greater control over the electromagnetic far- and near-field of the device improving its efficiency, directionality and versatility. Although dipole-shaped electromagnetic elements are shown in FIGS. 3A and 3B, any of a variety of electromagnetic elements appropriate to a specific application can be utilized in accordance with embodiments of the invention.

Figure 4:
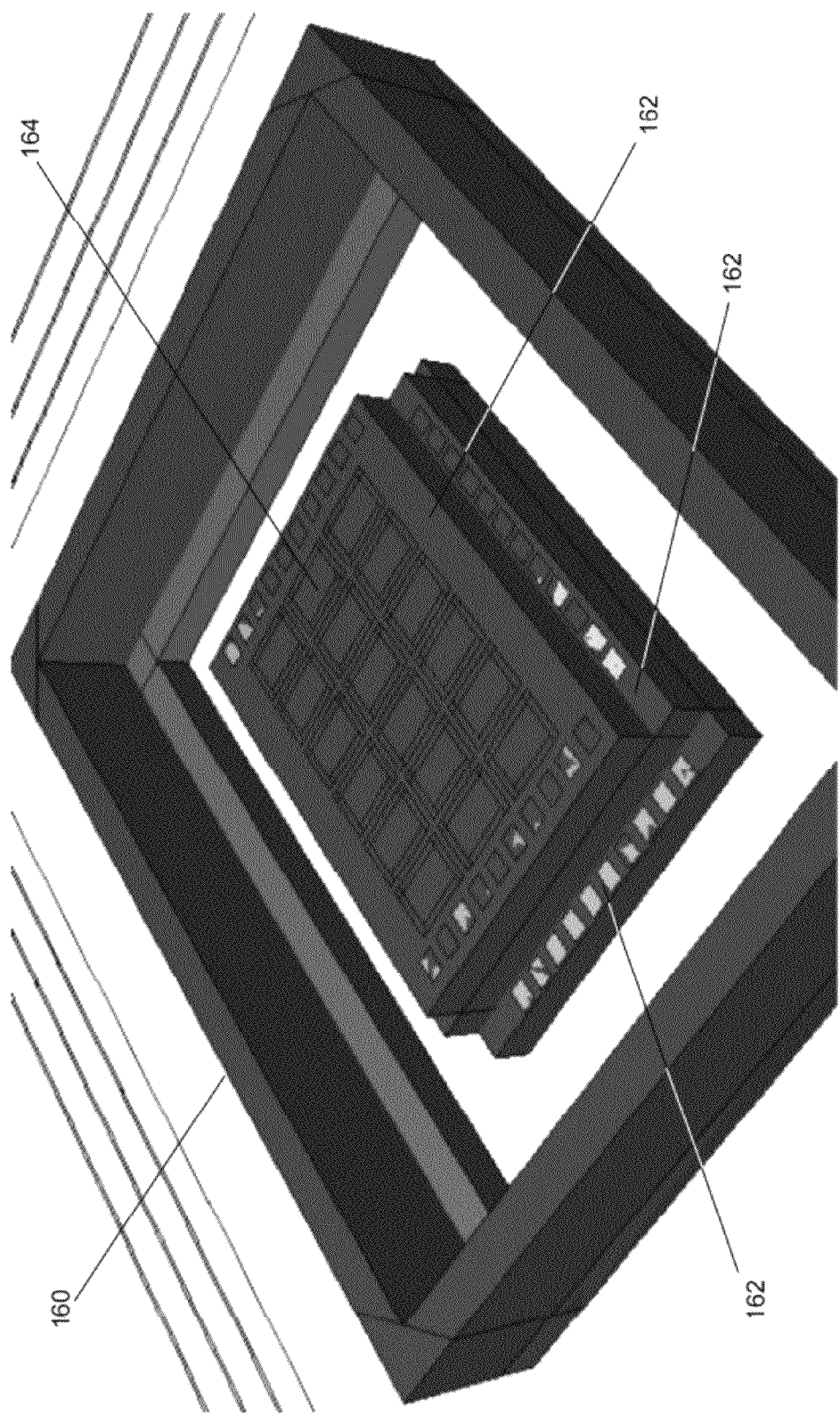
FIG. 4 is a three dimensional conceptual illustrations of packaging containing an integrated 3-dimensional electromagnetic element array including spiral electromagnetic elements in accordance with embodiments of the invention. Details such as bonding pads and integrated circuitry are omitted for clarity.

Packaging containing an integrated 3-dimensional antenna formed using three semiconductor substrates on which spiral shaped electromagnetic elements are formed in accordance with an embodiment of the invention is illustrated in FIG. 4. The packaging 160 includes a bulk resonator formed from three semiconductor dies 162 on which spiral electromagnetic elements 164 are formed. As with the integrated 3-dimensional antenna shown in FIGS. 3A and 3B spiral electromagnetic elements 164 are located on the surface of the bulk resonator and are buried (not shown) in the bulk resonator.

The construction of integrated 3-dimensional antennas in accordance with embodiments of the invention is not limited to stacks of integrated silicon die alone. For example, processes can be developed that can construct a single layer bulk resonator containing a 3-dimensional electromagnetic element array. In addition, electronics and electromagnetic elements can be completely integrated with optics using materials other than doped silicon as part of the die stack. Additional techniques for constructing 3-dimensional electromagnetic element arrays in accordance with embodiments of the invention are discussed further below.

Integrated 3-Dimensional Antenna Arrays Incorporating Intermediate Dielectric Layers In many embodiments, since doped semiconductor materials typically have a loss tangent, an integrated 3-dimensional electromagnetic element array is constructed using a die stack of thinned semiconductor dies separated by intermediate dielectric layers. In a number of embodiments, the intermediate dielectric layers are constructed from undoped semiconductor material or other materials that reduce losses. In a number of embodiments, the dielectric layers are regions of different doping and/or permittivity in the semiconductor substrates used to form the die stack and contribute to the material properties of the overall bulk resonator.

Figure 5:
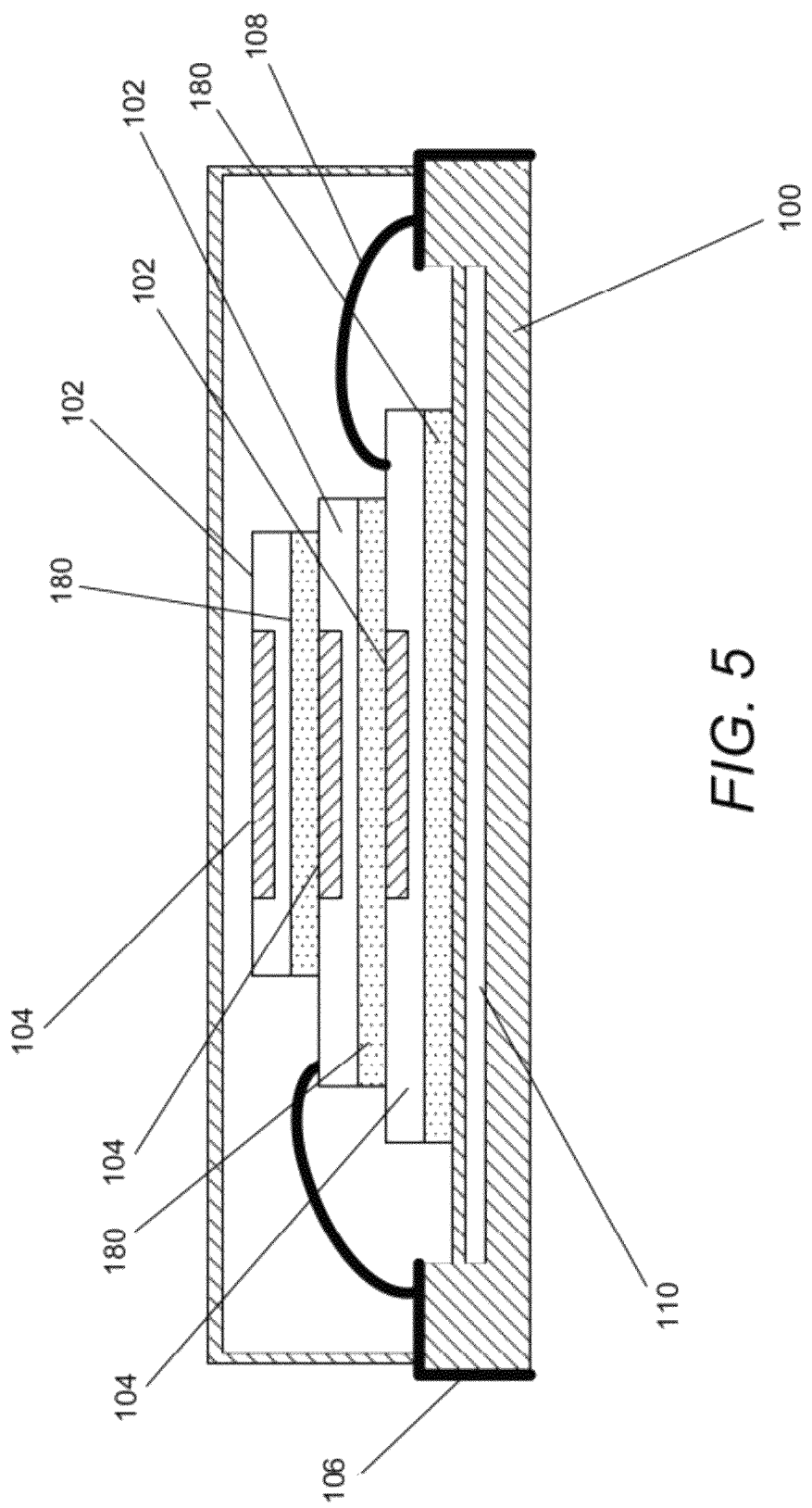
FIG. 5 is a conceptual illustration of a package containing an integrated 3-dimensional electromagnetic element array formed using a die stack including intermediate dielectric layers in accordance with an embodiment of the invention.

A package including an integrated 3-dimensional electromagnetic element array similar to the package shown in FIG. 2 with the exception that the die stack includes intermediate dielectric layers in accordance with embodiments of the invention is illustrated in FIG. 5. In the illustrated embodiment, the die stack is formed from doped semiconductor dies 104 separated by intermediate dielectric layers 180. In many embodiments the intermediate dielectric layers are made from undoped semiconductor material. In other embodiments, any of a variety of materials that reduce losses within the bulk resonator formed by the die stack can be utilized in the construction of the intermediate dielectric layers.

Design of Integrated 3-Dimensional Electromagnetic Element Arrays

When designing integrated circuit antennas, the immediate electromagnetic surrounding is typically taken into account. This includes the type of antenna used as well as packaging options. Besides packaging options such as flip-chip or attaching the integrated circuit to a ground plane, designers currently have a choice over substrate thickness (typically with minimum and maximum boundaries). The choice of substrate thickness affects traditional integrated antennas whenever electromagnetic energy is coupled into the substrate. Some antenna structures such as patch-antennas do not couple into the bulk substrate, as they provide close-by return current paths, but these antennas can have disadvantages in some applications, most notably their narrow-band nature, as the effective substrate is a thin film in the vicinity of the top of the die. Substrate thickness plays a role because it affects the available substrate modes, which are typically undesirable for integrated antennas as they confine electromagnetic energy into the substrate leading to energy losses.

In many conventional antennas, the strength of the induced substrate modes and hence the incurred losses is a function of frequency and substrate thickness, and since all electromagnetic elements in a traditional integrated planar array have the same spacing from the back-side, no additional degrees of freedom for influencing the relative strengths of excited modes exists by employing an array. By thinning the substrate, fewer substrate modes exist and hence losses are generally lower and achievable bandwidths are wider. However, with thinner substrates, controlling the directionality of an antenna beam becomes very difficult as electromagnetic energy easily leaks out in many directions. Thus, using planar integrated circuit antennas typically limits achievable performance because currents are limited to a surface and will excite the same ratio of different substrate modes.

Improving Antenna Efficiency

Increasing the dimensionality of an antenna array to include a third dimension and, in many embodiments, electromagnetic elements buried within the bulk resonator allows an additional degree of freedom in controlling the substrate modes that are excited or absorbed. In the ideal case, the entire near-field in the bulk resonator can be influenced and hence any interaction with the outside world can be realized, whereas in the planar case not enough boundary conditions exist leading to the trade-offs mentioned above.

Figure 6A:
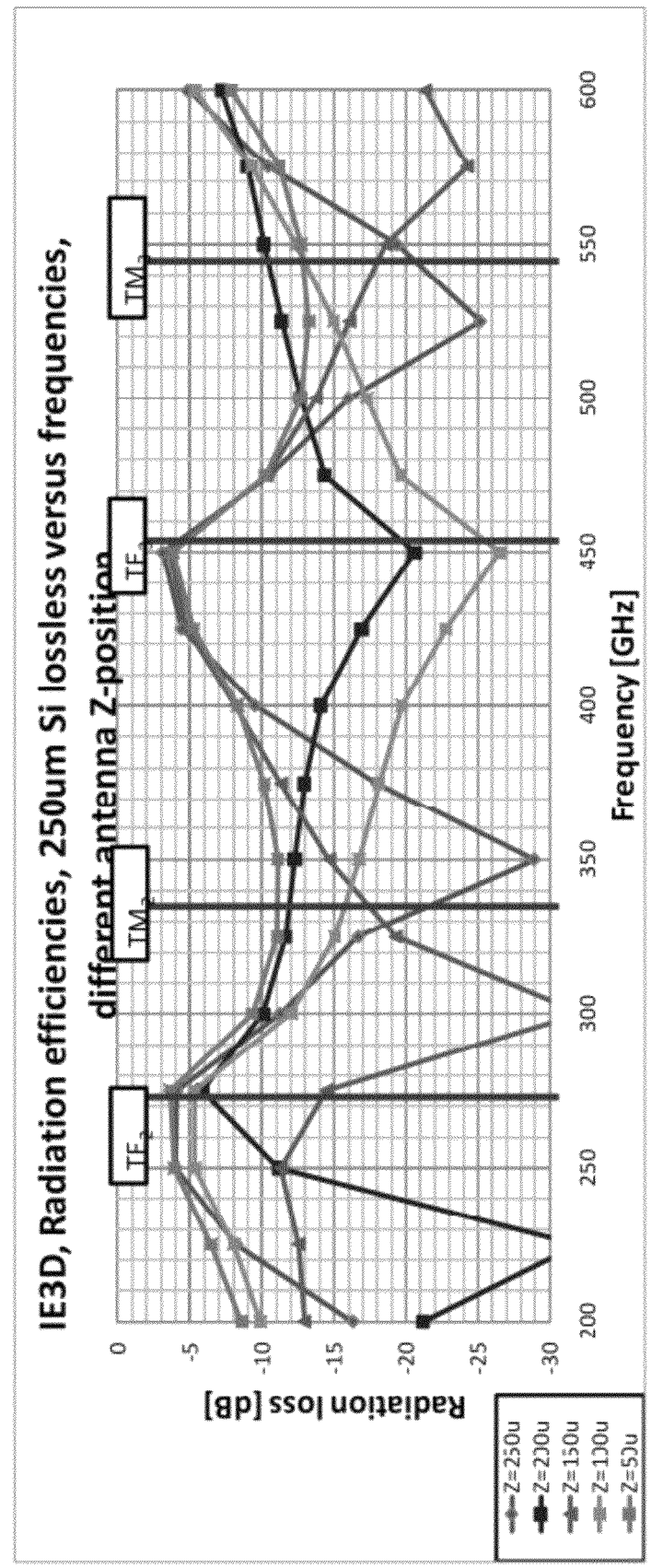
FIG. 6A is a chart showing simulated radiation efficiencies for an electromagnetic element located at different depths within a 250 μm bulk resonator.

To illustrate this point, the radiation efficiency into free space (air) of a single, optimally sized dipole on top of an infinite (x,y-extent) silicon substrate on top of a ground plane at different heights is shown in FIG. 6A. In the simulation illustrated in FIG. 6A, silicon and metals are assumed lossless and the antenna is positioned at various heights within the substrate. Most notably, antennas buried in the substrate exhibit different behavior over frequency compared to surface antennas because they excite different bulk/substrate modes. Therefore, having control over antennas in three dimensions compared to two provides additional degrees of freedom and can therefore greatly alleviate the trade-offs mentioned above.

Figure 6B:
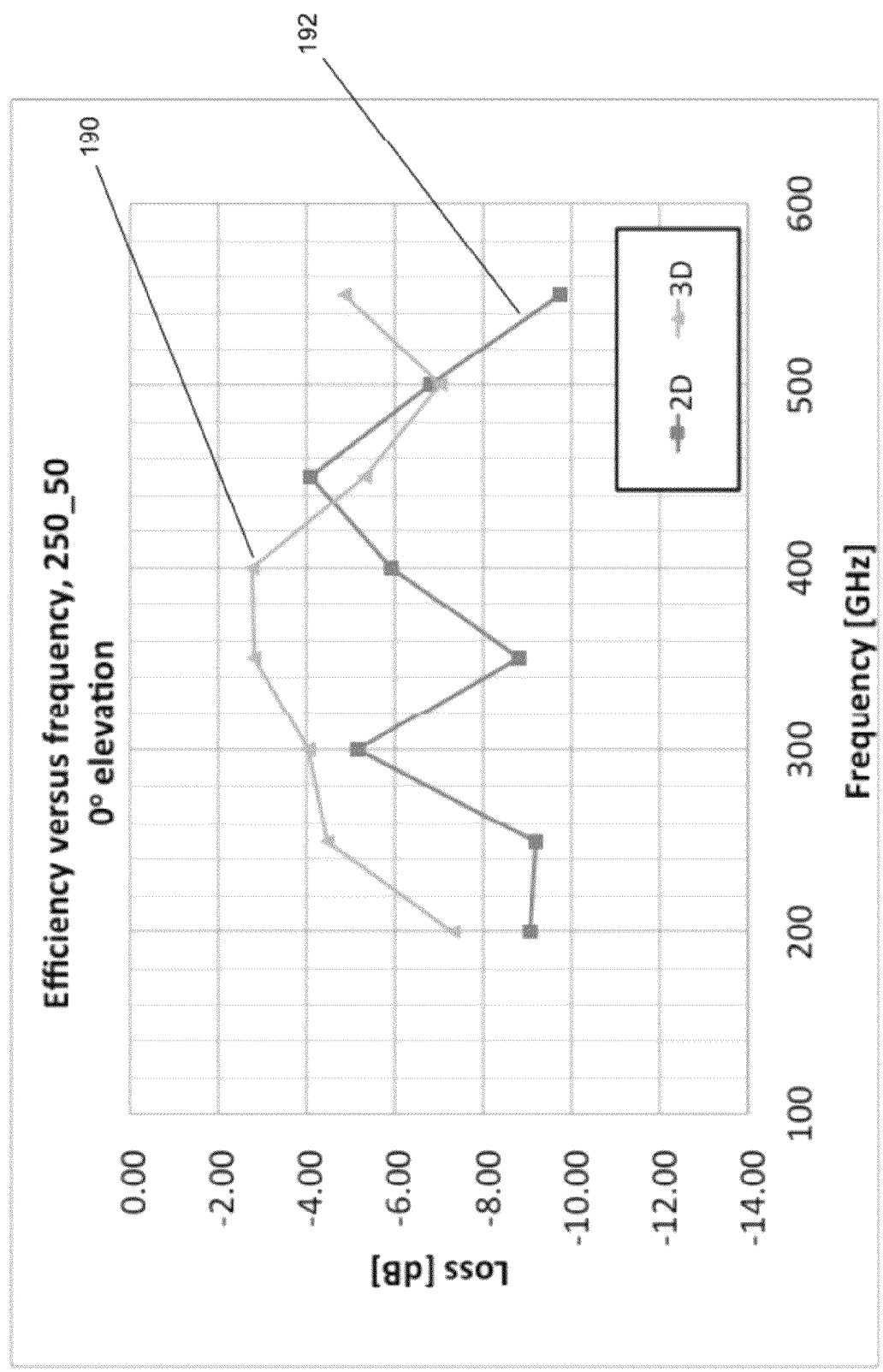
FIG. 6B is a chart that compares the efficiency versus frequency of a 2-dimensional electromagnetic element array and a 3-dimensional electromagnetic element array in which electromagnetic elements are buried within the bulk resonator in accordance with embodiments of the invention.

The efficiency for upwards radiation for a 3-dimensional antenna can be compared to the 2-dimensional case. FIG. 6B compares radiation efficiencies for the case of an integrated 3-dimensional antenna versus a planar 2-dimensional case. The quantity actually maximized is directionality. As can be appreciated from FIG. 6B, the integrated 3-dimensional antenna achieves higher efficiency over a wider frequency range.

Improving Antenna Directionality

Figure 7A:
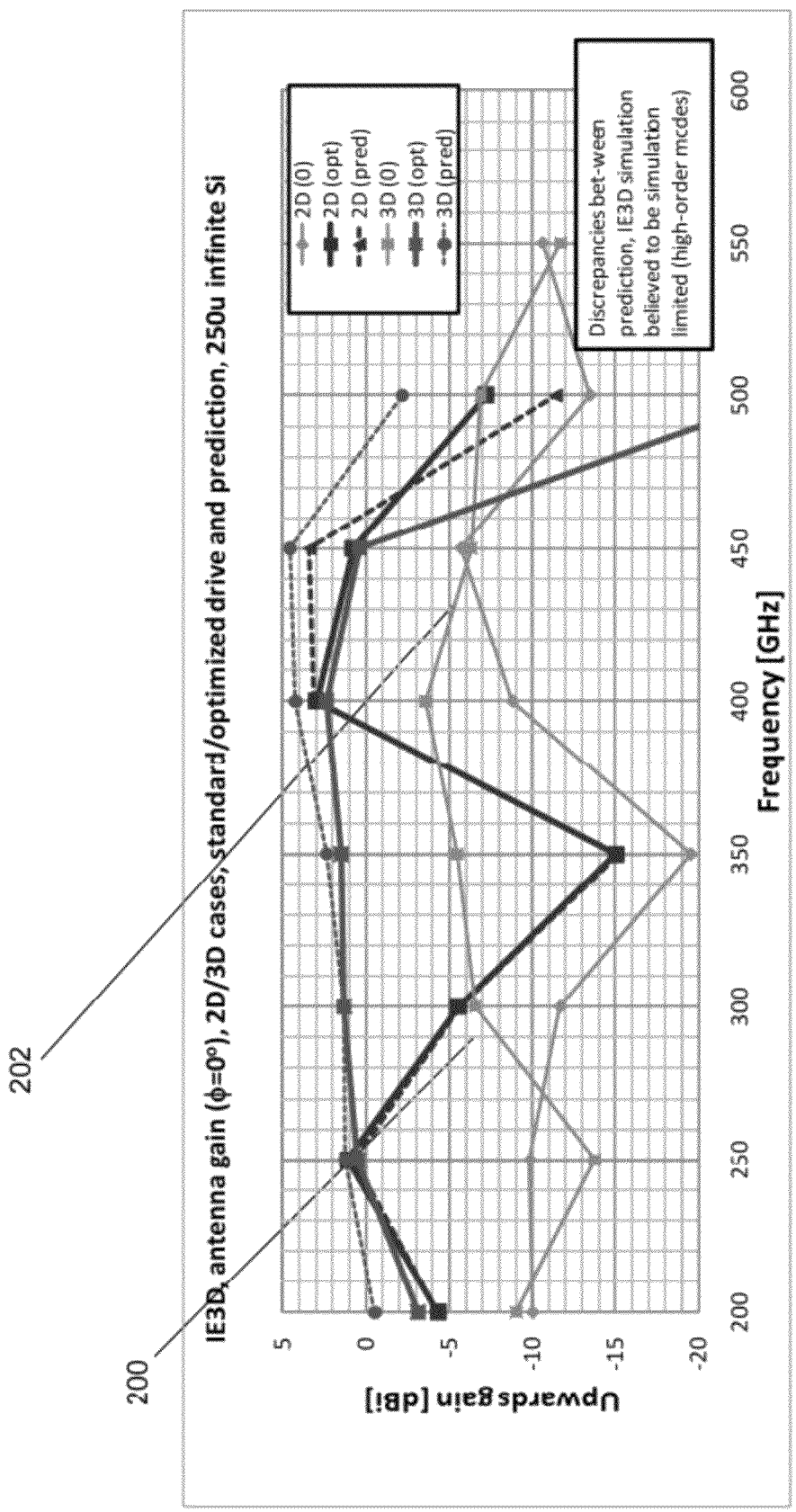
FIG. 7A is a chart that compares antenna gain versus frequency for a 2-dimensional electromagnetic element array and a 3-dimensional electromagnetic element array in which electromagnetic elements are buried within the bulk resonator in accordance with embodiments of the invention.
Figure 7B:
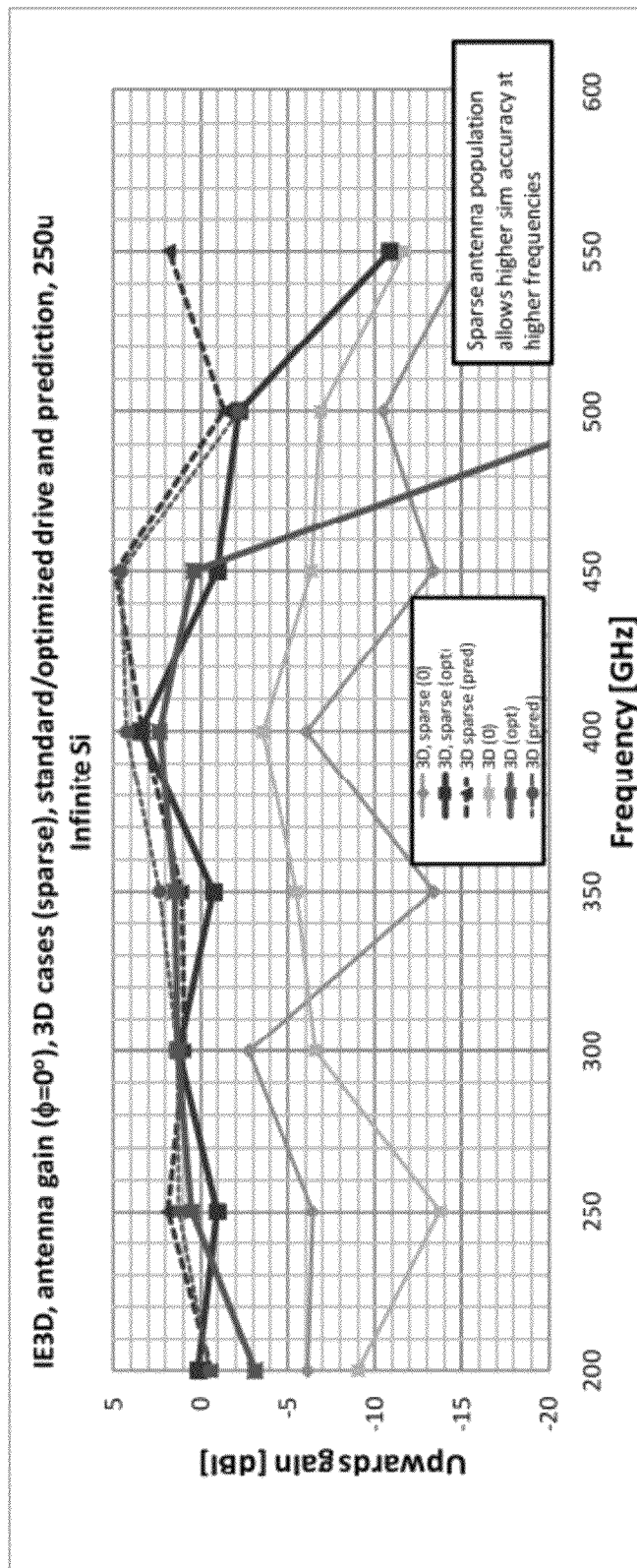
FIG. 7B is a chart that compares antenna gain versus frequency for different 3-dimensional electromagnetic element arrays in which electromagnetic elements are buried within the bulk resonator in accordance with embodiments of the invention.

Directionality over a broad frequency range can be improved by using 3-dimensional electromagnetic element arrays compared to 2-dimensional planar electromagnetic element arrays as is illustrated in FIG. 7A. In the illustrated embodiment, the power radiated upwards into free space is maximized for 2-dimensional and 3-dimensional electromagnetic element arrays on a 250 μm thick infinite silicon substrate. To determine the drive at each electromagnetic element, an s-parameter solver minimizing input power while keeping the detected power at a sense antenna in the up-direction constant can be used that iteratively solves for the optimum. Predicted and simulated results are shown in FIG. 7A. Comparing the performance of the 3-dimensional electromagnetic element array (200) and the 2-dimensional planar electromagnetic element array (202) illustrates that the mere presence of electromagnetic elements at depth improves performance. Remaining discrepancies are due to the available simulation grid fineness in the tool that was used for the simulation and its memory requirements. FIG. 7B shows a graph comparing two different 3-dimensional electromagnetic element array configurations (one sparse, and one dense) that differ in the positioning and number of electromagnetic elements. Using a sparser set of electromagnetic elements, simulation accuracy is improved.

Figure 8:
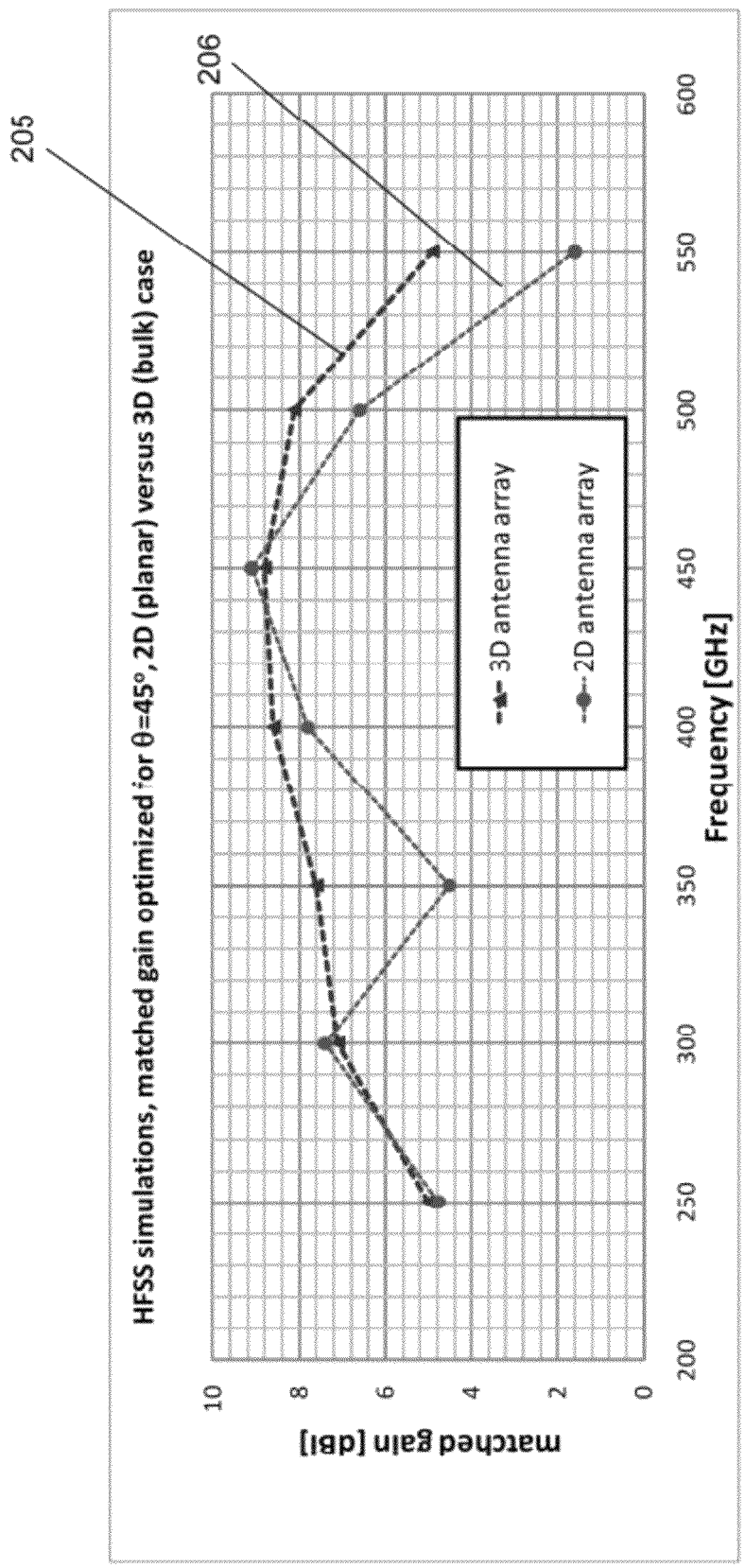
FIG. 8 is chart that compares matched gain versus frequency for a 2-dimensional electromagnetic element array and a 3-dimensional electromagnetic element array in which electromagnetic elements are buried within the bulk resonator in accordance with embodiments of the invention.
Figure 10A:
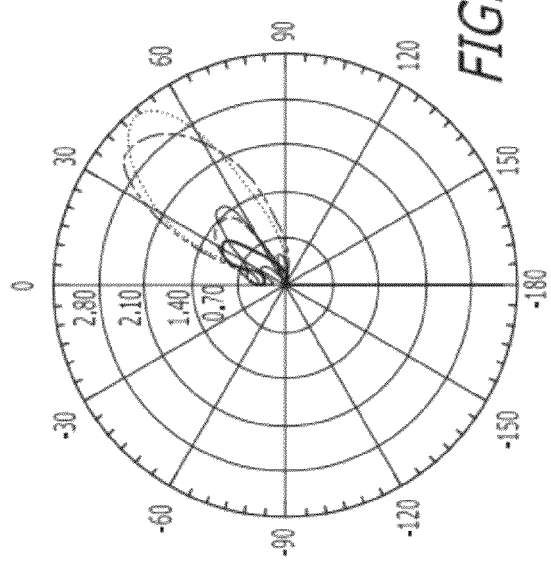
FIGS. 10A-10F are polar plots of simulated radiation patterns for 3-dimensional planar electromagnetic element arrays including buried electromagnetic elements in accordance with embodiments of the invention at different frequencies from 250, 300, 400, 450, 500, and 550 GHz respectively.
Figure 10B:
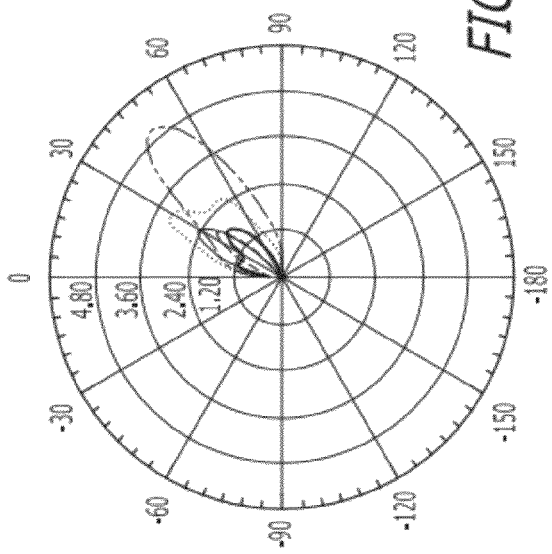
Figure 9A:
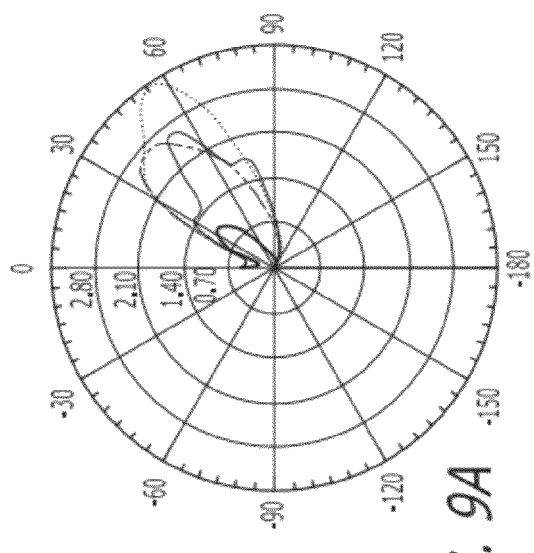
FIGS. 9A-9F are polar plots of simulated radiation patterns for 2-dimensional planar electromagnetic element arrays at different frequencies from 250, 300, 400, 450, 500, and 550 GHz respectively.
Figure 9B:
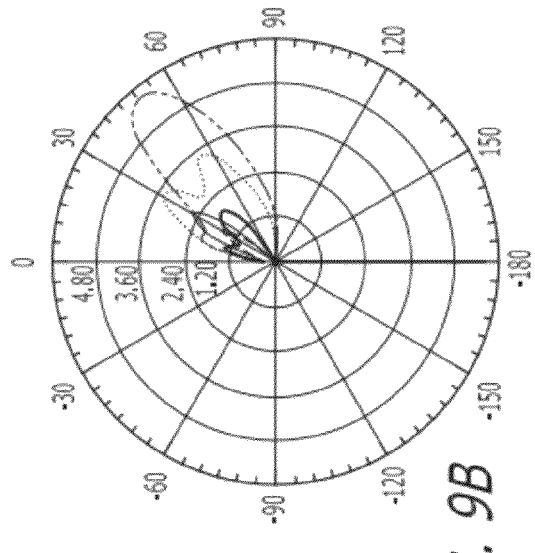
Figure 9C:
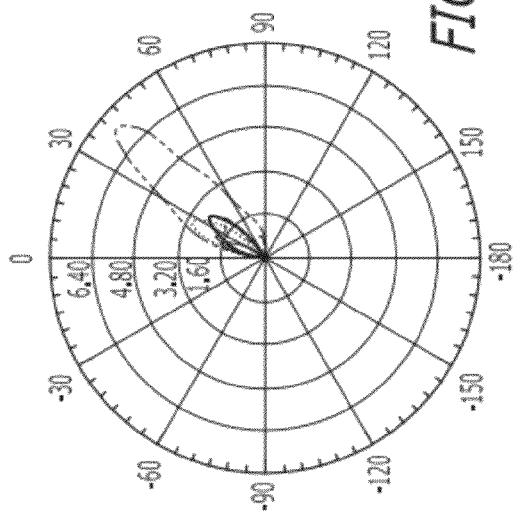
Figure 9D:
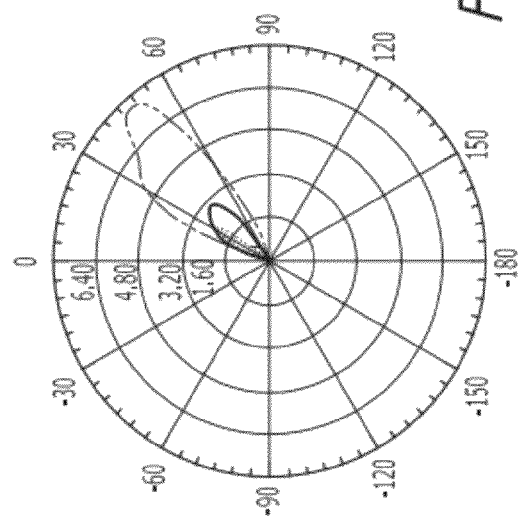
Figure 10C:
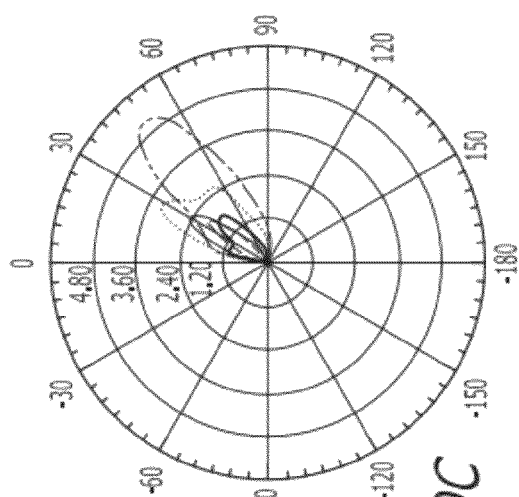
Figure 10D:
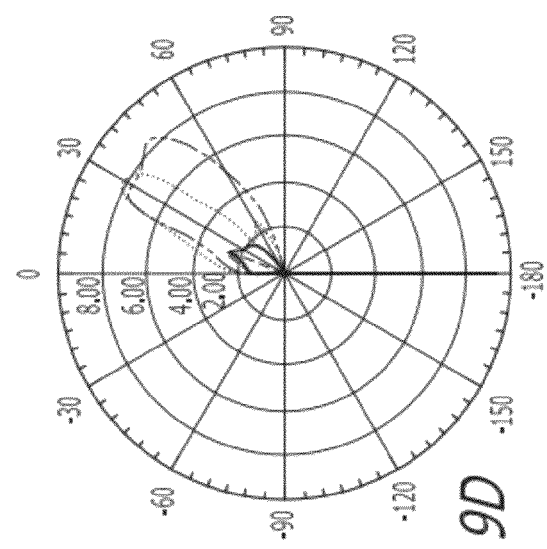
Figure 10E:
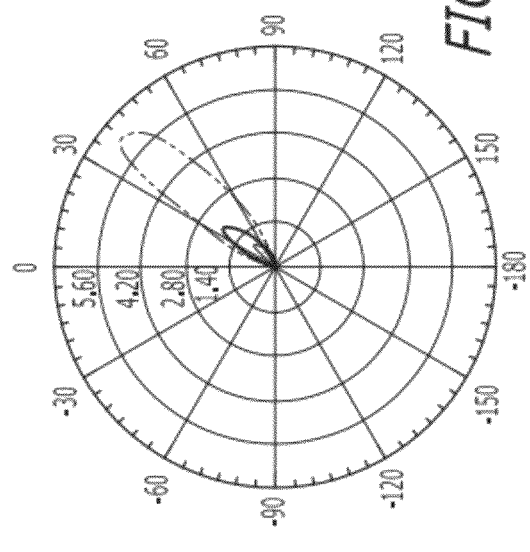
Figure 10F:
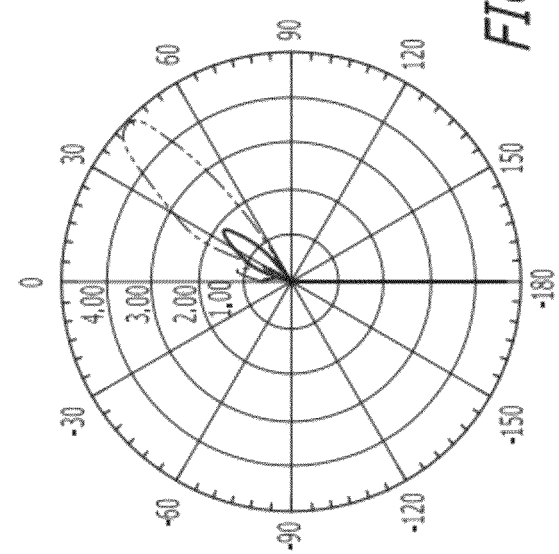
Figure 9E:
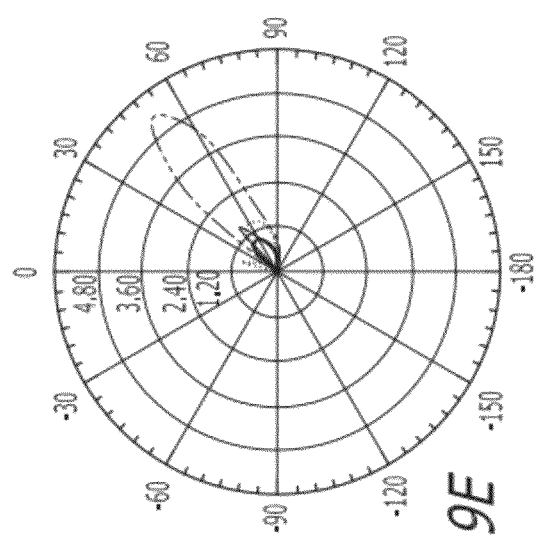
Figure 9F:

Sideway radiation can also be significantly improved using electromagnetic elements located within a bulk resonator. To illustrate the performance improvement that can be achieved, a simulation can be performed using an electromagnetic element array that is symmetric in the E-plane. In the simulation, the 45° direction is optimized. The results of the simulation are shown in FIG. 8. The chart shown in FIG. 8, illustrates that the matched gain achieved in the desired direction is improved using a 3-dimensional array of electromagnetic elements (205) when compared with a 2-dimensional planar array (206). FIGS. 9A-9F show polar plots of radiation patterns simulated for the 2-dimensional array of electromagnetic elements versus elevation for different azimuths at 250, 300, 400, 450, 500, and 550 GHz respectively. FIGS. 10A-10F show polar plots of radiation patterns simulated for the 3-dimensional arrays of electromagnetic elements versus elevation for different azimuths at 250, 300, 400, 450, 500, and 550 GHz respectively. Besides the improvement in directionality achieved with the 3-dimensional array of electromagnetic elements, the patterns for the 3-dimensional electromagnetic element array exhibit lower side-lobe levels.

The 3-dimensional antenna arrays outlined above can be utilized to implement a variety of different classes of device having improved efficiency, directionality, and versatility compared to that of a device constructed using a 2-dimensional planar antenna array. Different types of integrated 3-dimensional electromagnetic element array based devices in accordance with embodiments of the invention are discussed below.

Integrated Transmit and Receive Antennas

In many embodiments, the techniques described above are utilized to construct an integrated 3-dimensional transmit/or receive antenna. The performance of antennas and antenna arrays for both transmit and receive modes can be significantly improved using 3-dimensional arrays of electromagnetic elements compared to 2-dimensional planar arrays of electromagnetic elements. This has been demonstrated in simulations using active amplitude- and phased-arrays. The technique is not limited to such arrays, but also applicable to reflect single antennas in reflect arrays (that contain a single power source and integrated reflectors).

Integrated antennas and antenna arrays can benefit from the use of 3-dimensional electromagnetic element arrays, because the inclusion of a 3-dimensional array of electromagnetic elements enables greater control over both the electromagnetic far- and near-field in order to obtain a desirable electromagnetic far-field pattern with minimal energy loss and optimal directionality. Besides the far-field electromagnetic pattern that antennas ultimately strive to achieve, it is important to emphasize that the improvements described above are achieved by manipulating both electromagnetic field domains.

Active, Electromagnetically Manipulated Shutters and Reflectors

Electromagnetic near-field manipulation using 3-dimensional electromagnetic element arrays can be utilized to implement a variety of different classes of device. Examples of such devices are electronically manipulated shutters and reflectors (or mirrors), in other words structures that are transparent or reflective to incoming radiation. Those structures can be used to guide radiation within the bulk resonator or through a substrate interface. For example a shutter could be used to block or trap energy inside a substrate (by reflecting energy back) until it is "opened" (i.e. made transparent).

Figure 11A:
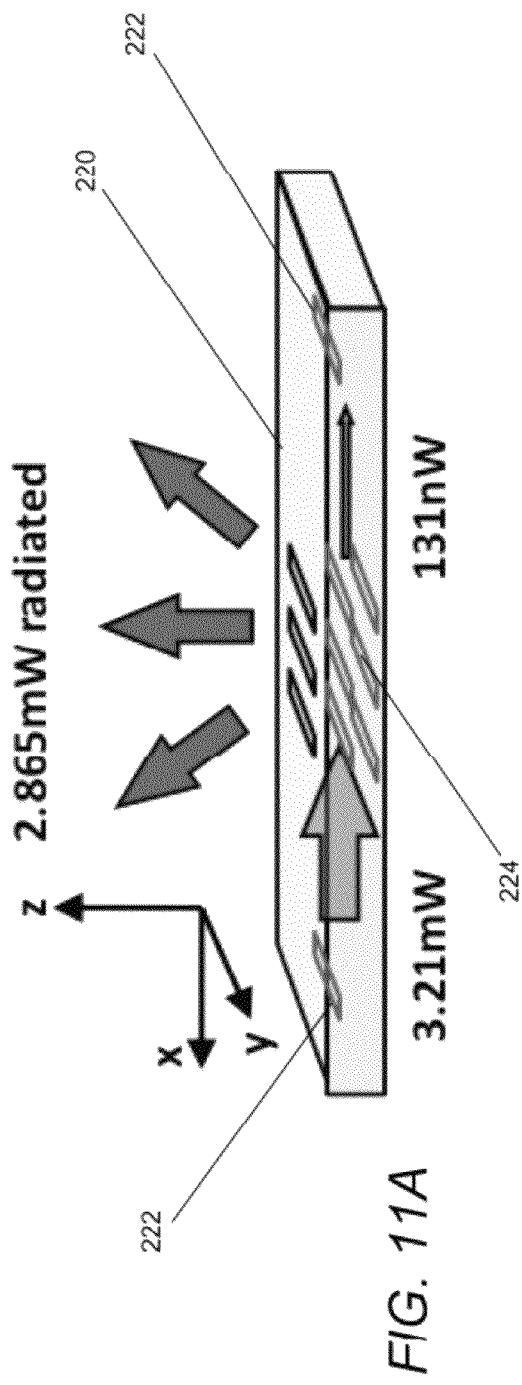
FIG. 11A is a power flow diagram corresponding to a bulk resonator containing a 3-dimensional electromagnetic element array including buried electromagnetic elements with electromagnetic energy flow directed towards the air.
Figure 11B:
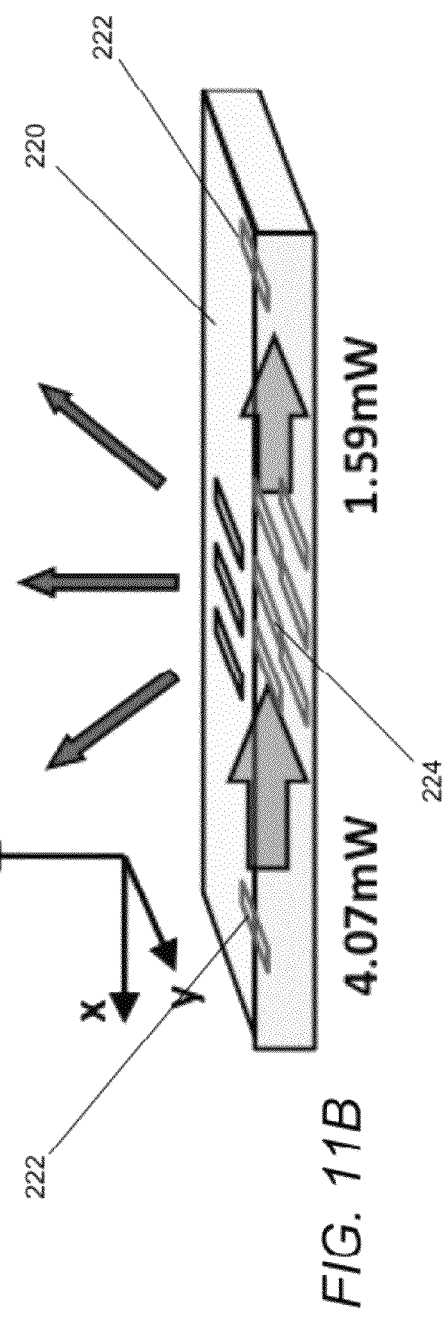
FIG. 11B is a power flow diagram corresponding to a bulk resonator containing a 3-dimensional electromagnetic element array including buried electromagnetic elements with electromagnetic energy flow directed within the bulk resonator.

The ability of 3-dimensional electromagnetic element arrays to guide radiation within a bulk resonator in accordance with embodiments of the invention is illustrated in FIGS. 11A and 11B. FIGS. 11A and 11B illustrate a slab 220 of lossless, silicon bulk material of 250 μm thickness placed on a conducting ground plane, and including two dipole antennas 222, one on each end. These dipoles, at a depth of 125 μm, are test dipoles to excite and sense electromagnetic energy flow inside the substrate (approximately 65% of the energy excites substrate modes in this setup). Between the two dipoles an array of electromagnetic elements (224) is located, where the electromagnetic elements are manipulated passively (i.e. they do not absorb or radiate energy) and, in tandem, act as a reconfigurable reflector.

FIG. 11A illustrates a power flow diagram when the electromagnetic element array (224) is reactively loaded to maximize the radiated energy, while minimizing the energy to the bulk sensing antenna 222. The values illustrated in FIG. 11A and discussed below are obtained by optimizing the electromagnetic element array for radiated power using a simulation involving a specific configuration of sense antennas. In the illustrated embodiment, submitted power is 3.21 mW, with 95.8 uW detected at the sense antennas (2.98% of the submitted power sensed versus 1.44% sensed when an equivalent 2-dimensional antenna array is used, corresponding to approximately 3 dB higher directivity). The bulk sensor receives 131 nW, corresponding to 0.04% of the power submitted (an equivalent 2-dimensional antenna array achieves 0.12%).

Using the 3-dimensional electromagnetic element array to direct the energy towards the bulk sensing antenna 222 results in the power flow shown in FIG. 11B. Of the 4.07 mW submitted, 1.59 mW is absorbed in the bulk sense antenna 222, and 2.02 mW is radiated into air. Because only 65% of the power is directed towards bulk modes, 1.4 mW of the 2.02 mW would have been radiated in any case (since the element array is several wavelengths away) and that the additional "spill-over" radiation is as low as 600 μW. This demonstrates significant entrapment of power in the bulk resonator can be achieved.

Using electromagnetic elements in a full 3-dimensional arrangement; programmable reflectors can be implemented in accordance with embodiments of the invention with significantly improved directivity compared to an equivalent two-dimensional planar array of electromagnetic elements. Because all manipulation was accomplished using reactive tunings only, reprogrammable structures that can selectively reflect, entrap and/or direct the flow of energy can be implemented in accordance with embodiments of the invention.

Using Electronically Manipulated Reflectors to Create Pulsed Sources

Electronically manipulated reflectors that can direct flow of electromagnetic energy can be utilized in a variety of other applications including (but not limited to) pulsed sources. A pulsed source that uses a bulk resonator to selective trap energy or, alternatively, radiate it can be implemented using a 3-dimensional array of electromagnetic elements in accordance with embodiments of the invention. To illustrate the benefits of utilizing a 3-dimensional array of electromagnetic elements versus a traditional, planar dipole array, a comparison can be performed by simulating both configurations in a lossy (1 S/m), 250 μm thick piece of silicon on a ground plane. The top-center electromagnetic element in both cases is driven to supply power (at 450 GHz), and the remaining elements are reactively tuned to selectively entrap energy in the substrate ("storage mode") or radiate energy upwards ("radiation mode").

In the traditional planar case, during storage-mode, the input source provides 124.6 μW, of which 60.6% is radiated into air due to imperfect containment. The input impedance seen at the source is 20.2 $\Omega$+111.5 j $\Omega$, corresponding to a quality factor of 5.5 (the ratio of energy stored versus energy dissipated). The power detected at the air sensor is 88.4 nW. Switching to radiation-mode, input power increases to 253.2 μW, the input impedance seen changes to 43 $\Omega$+107.8 j$\Omega$ (quality factor of 2.5) and radiation efficiency changes to 88.9% with 2.84 μW sensed at the sensor, an increase of 15 dB. From the radiation pattern, the gain in the upward direction changes from −3.2 dB to 5.8 dB (the sense antenna aperture shields some of the outgoing radiation).

For the case of a 3-dimensional electromagnetic element array, in the storage mode, the input power is 63.3 uW and power sensed is 17.7 nW. Input impedance is 8.5 $\Omega$+102.9 j$\Omega$, corresponding to a quality factor of 12. The radiation efficiency is 24.1%. Therefore, significantly more energy is stored in the bulk and leakage radiation is reduced significantly compared to the planar case. Switching to radiation mode, the sensor now registers 7.74 uW with 323.9$\Omega$ input power. The antenna gain increases from −7.3 dB to 9.62 dB in the upward direction compared to the storage-mode. The input impedance is 45.2 $\Omega$+95.2 j $\Omega$, corresponding to a quality factor of 2.

Figure 12B:
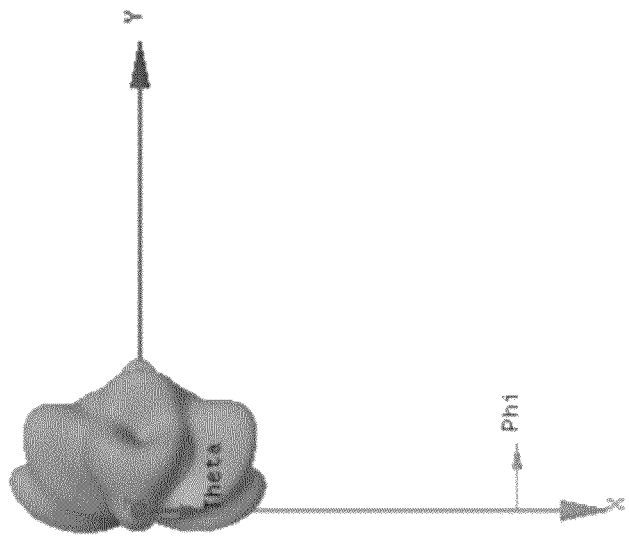
FIGS. 12A-12D are graphs illustrating simulated radiation patterns for a pulsed source implemented using a 2-dimensional planar array of electromagnetic elements and a pulsed source implemented using a 3-dimensional array of electromagnetic elements including electromagnetic elements buried within the bulk resonator in accordance with an embodiment of the invention.
Figure 12A:
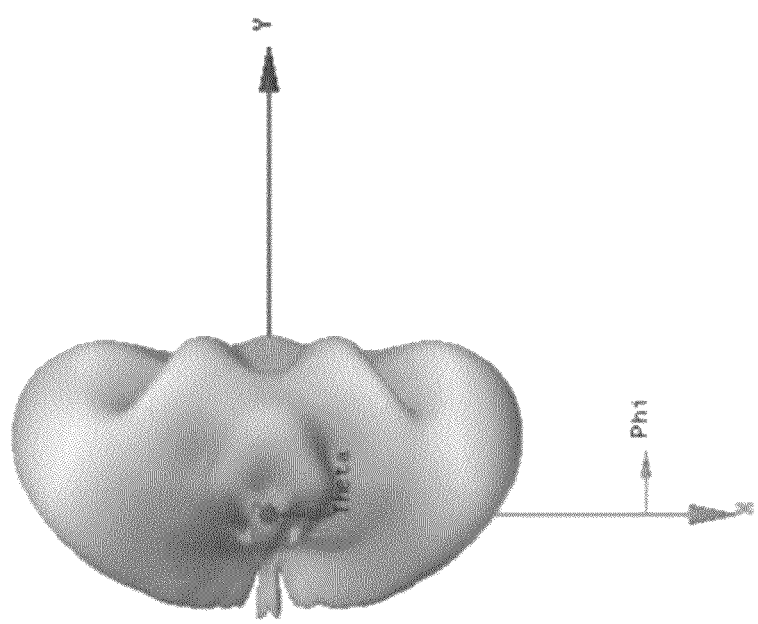

FIGS. 12A and 12B compare the radiation pattern for both cases in the storage phase. FIG. 12A illustrates the radiation pattern of the 2-dimensional electromagnetic element array during the storage phase (radiation efficiency 60.6%, i.e. only 39.4% of the energy is stored) and FIG. 12B illustrates the radiation pattern of the 3-dimensional electromagnetic element array during the storage phase (radiation efficiency 24.1% meaning that 75.9% of the energy is stored). As can be readily appreciated, a significant amount of power leakage occurs in the 2-dimensional electromagnetic element array compared with the 3-dimensional electromagnetic element array.

Figure 12D:
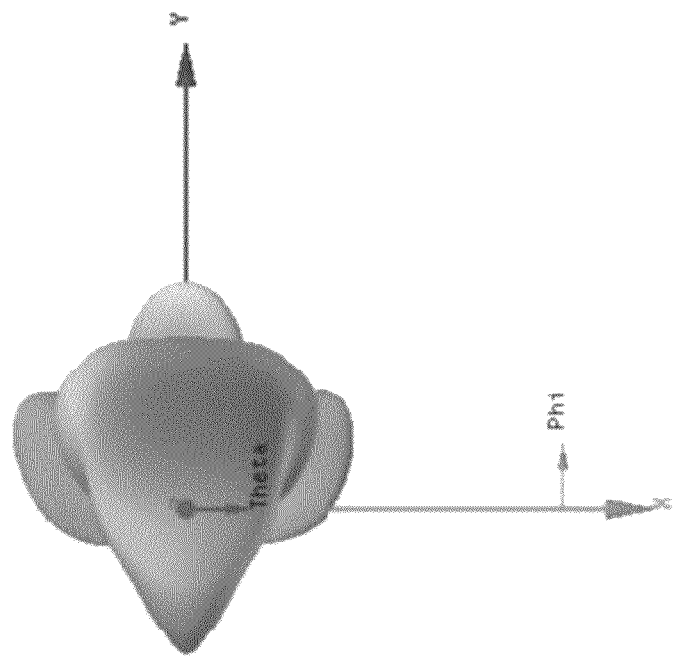
Figure 12C:
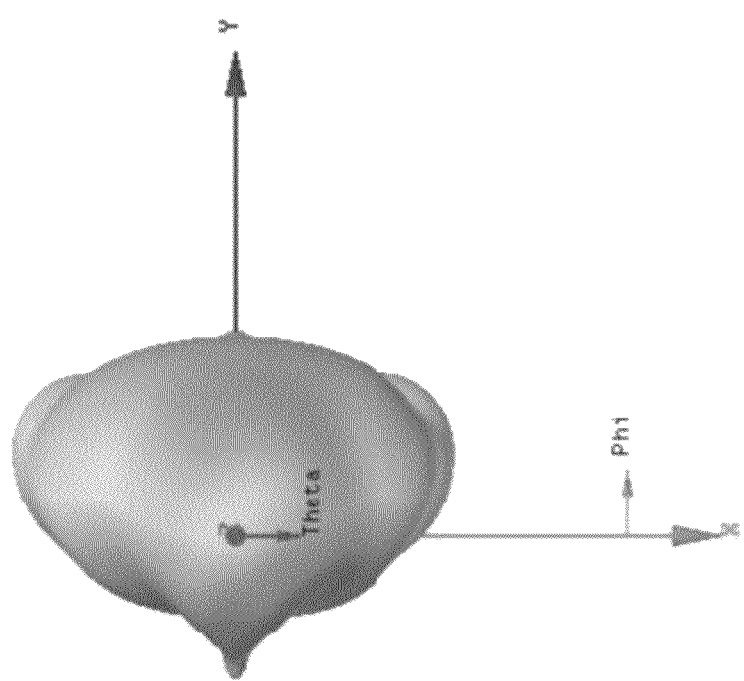

FIGS. 12C and 12D compare the radiation pattern for both cases in the radiation phase. FIG. 12C illustrates the radiation pattern of the 2-dimensional electromagnetic element array during the radiation phase (radiation efficiency 88.9%) and FIG. 12D illustrates the radiation pattern of the 3-dimensional electromagnetic element array during the radiation phase (radiation efficiency 72.5%). The higher directional gain, the larger contrast between storage- and radiation modes (compared to the planar case), as well as the increase in energy that can be stored in the bulk (as evidenced by the larger quality factor in storage mode) illustrate the usefulness of including electromagnetic elements in a 3-dimensional electromagnetic element array when implementing actively manipulated reflectors in accordance with embodiments of the invention.

Because electromagnetic simulation tools only provide steady-state solutions, it is difficult to predict time-transient behavior of the devices described above since that requires knowledge of delay in the system. However, delay is typically related to the physical size of the system. When the timing of switching between states is aligned with the delay in the system, a pulsed source can be implemented that can provide higher instantaneous power by utilizing the stored energy. The specifics depend on the horizontal and vertical dimensions of the bulk resonator. Similar techniques to those discussed above can be utilized to implement a number of other devices that employ 3-dimensional arrays of electromagnetic elements to influence the electromagnetic near-field to reflect, trap or block the flow of electromagnetic energy for the purpose of achieving desirable electromagnetic near- and far-fields including but not limited to shutters, reflectors, and flow-directors. Other devices that can be implemented using 3-dimensional arrays of electromagnetic elements to influence the electromagnetic near-field in accordance with embodiments of the invention are discussed below.

Active, Electromagnetically Manipulated Frequency-Selective Filters

An integrated 3-dimensional array of electromagnetic elements in accordance with embodiments of the invention can be used to control the electromagnetic near- and far-fields across frequencies. In many embodiments, 3-dimensional electromagnetic element arrays are used to implement frequency-selective filters that accept or reject electromagnetic energy depending on the frequency of the radiation. Because the elements are electronically tunable, the wavelength of highest absorption and/or rejection can be tuned.

Figure 13:
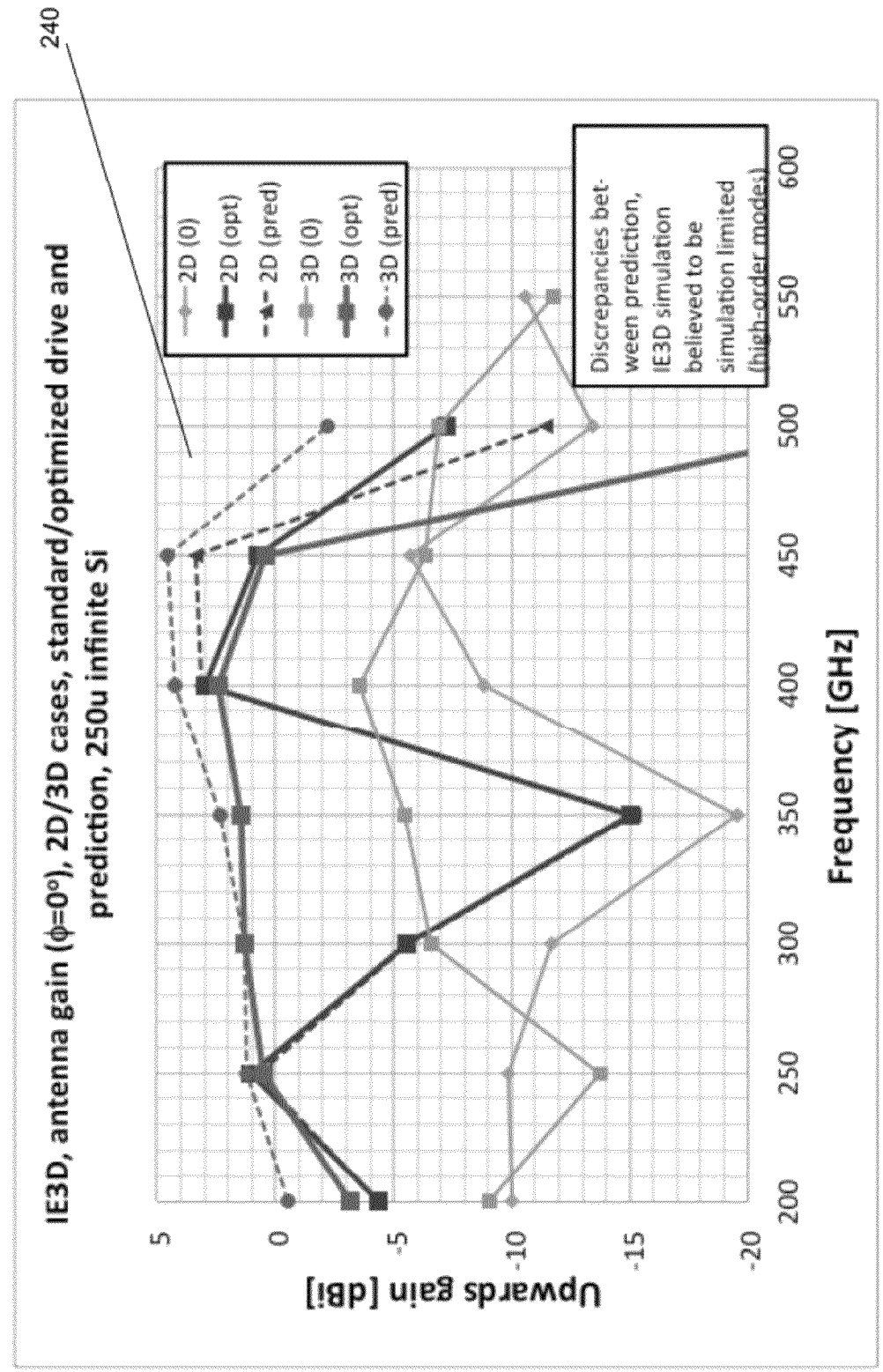
FIG. 13 is a chart illustrating the normalized antenna gain for a variety of passive 2-dimensional planar electromagnetic element arrays and 3-dimensional electromagnetic element arrays that include buried electromagnetic elements, where the antenna arrays are optimized for different frequencies.

A comparison of the frequency selective characteristics of 3-dimensional and 2-dimensional electromagnetic element arrays is illustrated in FIG. 13. The graph 240 shows the normalized antenna gain with the normalization done such that the maximum gain in the upwards direction is 0 dB. All solid lines are results for the 3-dimensional electromagnetic element array structure in accordance with embodiments of the invention and all broken lines are results for the traditional planar antenna array structure. Different tunings (i.e. changes in reactive loads on all but the top-center element) are shown. The 3-dimensional electromagnetic element array provides superior contrast and full usability over the frequency range, whereas the traditional, planar structure has low contrast due to multiple peaks and reduced range as it cannot effectively distinguish signals from 250 GHz to 350 GHz. Accordingly, a 3-dimensional electromagnetic element array can be utilized to provide an effective frequency-selective receiver, which can be useful in applications including but not limited to spectroscopic applications. In a number of embodiments, the top-center element of the frequency-selective receiver can use a wide-band power detector and the side- and bulk elements only need to implement reactively tuned electromagnetic elements (for example using varactors, which are available with reasonable quality factors even in current, high-volume commercial semiconductor processes) to implement a frequency-tunable power detector.

Because of reciprocity, the above array also can be operated as a transmit antenna tunable to a desired frequency range. This is useful as antennas are sized for operation in a particular center frequency. Because of reciprocity, in the case discussed here, the center antenna operated actively could also be tuned to transmit-rather than receive-within the range of frequencies discussed, thus making it possible to construct antennas operable over a wider range of frequencies when a 3-dimensional electromagnetic element array is used.

Figure 14:
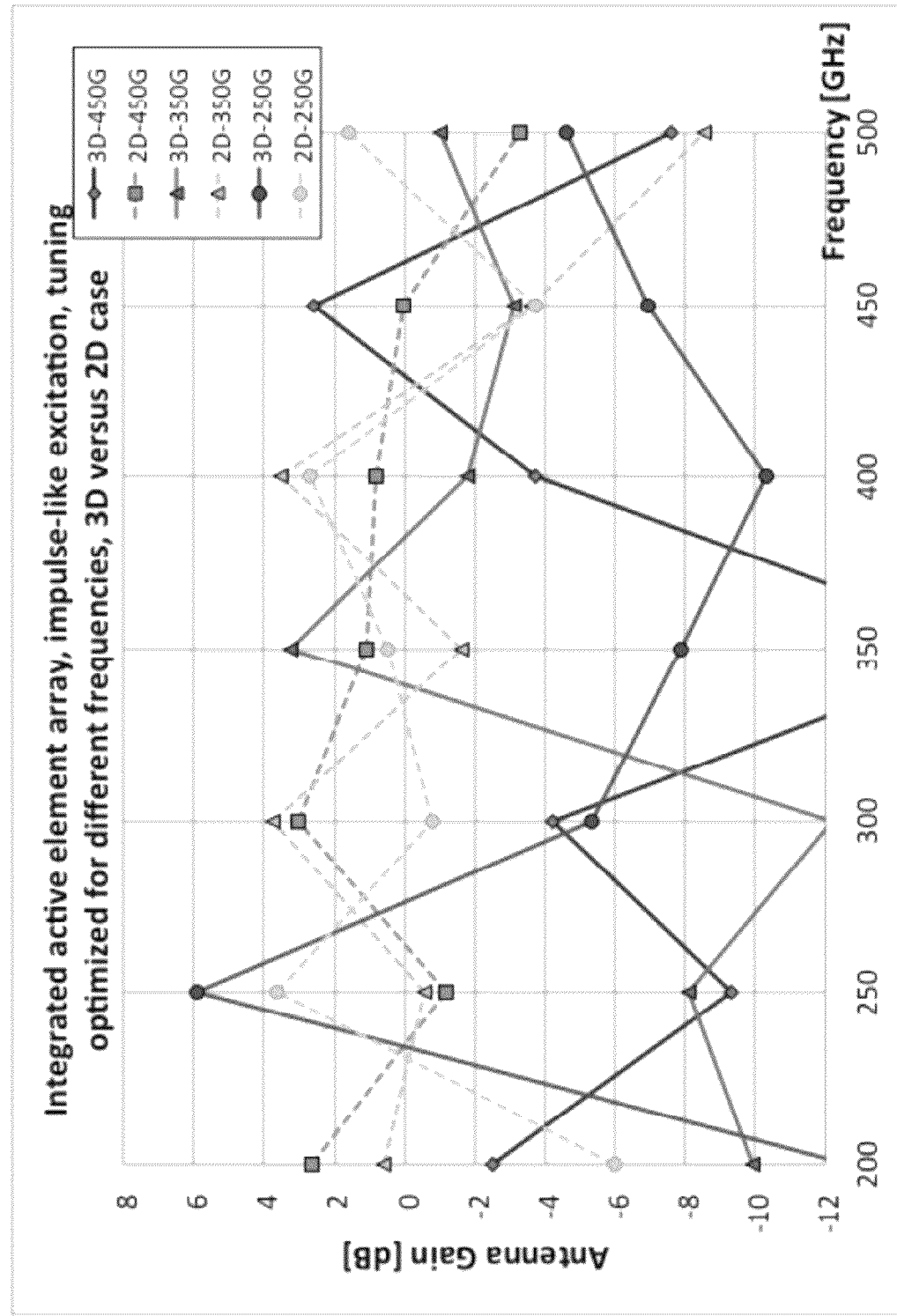
FIG. 14 is a chart illustrating the antenna gain for a variety of actively driven 2-dimensional planar electromagnetic element arrays and 3-dimensional electromagnetic element arrays that include buried electromagnetic elements, where the antenna arrays are optimized for different frequencies.

In many embodiments, the 3-dimensional electromagnetic element array is actively driven in such a way that each element is excited by an impulse of varying amplitude and phase (but such that the amplitude of the excitation is the same at all frequencies and that the phase lead/lag increases proportionally with frequency). The antenna gain of arrays in which amplitudes and phases at each element are optimized to maximize radiation straight up at 250 GHz, 350 GHz, and 450 GHz is illustrated in FIG. 14. The amplitudes applied are rounded off to within +/−5% of the center antenna amplitude. Very little contrast is achieved for the traditional planar case, whereas using a 3-dimensional array of electromagnetic elements again provides superior contrast.

Artificial Anisotropic Materials

Anisotropic materials are materials with material properties (such as permeability and permittivity) that are directionally dependent. Such directional dependency, among other things, can be useful to direct or block the flow of electromagnetic energy depending on the direction of the flow. Because materials used in standard commercial semiconductor processes are homogeneous, anisotropy in typical materials is achieved artificially, by placing elements that electromagnetically interact with the environment. Placing electromagnetic elements throughout the bulk resonator (not just on the surface) in accordance with embodiments of the invention can change the effective electric properties of a bulk resonator. Using planar elements only, the interaction is limited to two physical dimensions and it is hence very difficult to achieve anisotropy.

The ability of a 3-dimensional array of electromagnetic elements to modify the electric properties of a bulk resonator can be illustrated through simulation. For example, a simulation can be performed using a long slab of 250 µm thick lossless silicon placed on a ground-plane with dipole antennas at 125 µm depth on each end. In this configuration, the dipoles radiate both into the substrate as well as into air. In an infinite lossless substrate in this configuration, the radiation efficiency is 35%, i.e. 35% of the energy is radiated into air and 65% of the energy goes into the substrate. The two antennas are separated by 2 mm. In the center between the pair of dipoles are electromagnetic elements that are reactively loaded such that they act individually as (so-called) reflectors. The center elements are tuned to maximize the energy flow between the end dipoles in one direction and minimize it in the other direction with one end used as a transmitter and the other as a receiver interchangeably. The quantity maximized is the ratio of forward flow to reverse flow. In this configuration, the 3-dimension electromagnetic element array results is a ratio of 13.1 dB illustrating that flow can be directed to a much greater extent when a 3-dimensional array of electromagnetic elements is utilized.

Figure 15:
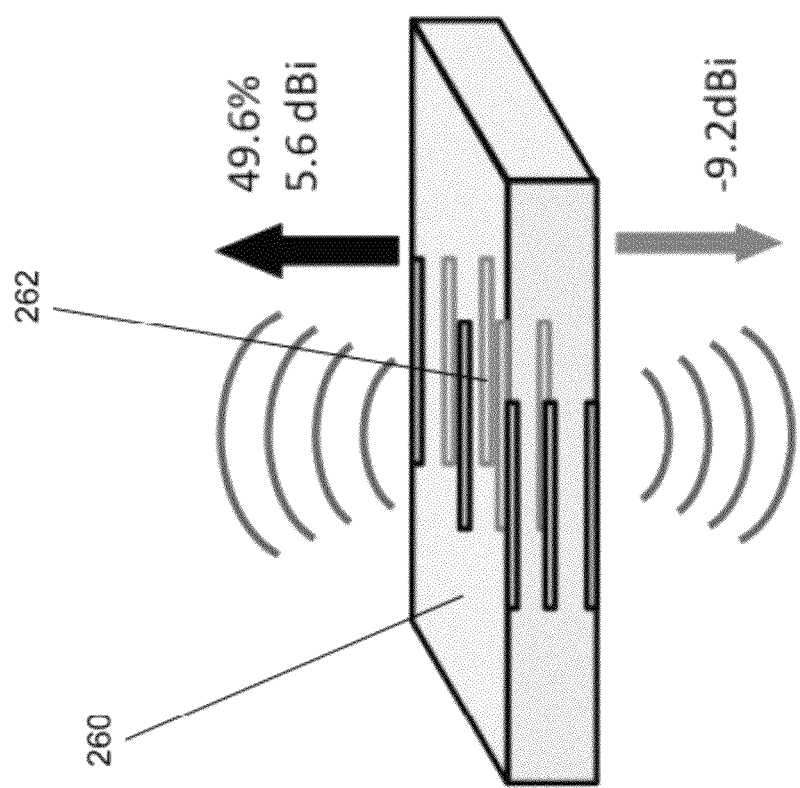
FIG. 15 is a power flow diagram corresponding to a bulk resonator containing a 3-dimensional electromagnetic element array including electromagnetic elements buried within the bulk resonator in accordance with embodiments of the invention, when electromagnetic energy flow is directed upward.

The ability to direct energy flows crossing a semiconductor to air interface can also be illustrated via simulation. In one example, a 250 µm piece of lossy (10 S/m) bulk semiconductor suspended in air is simulated. FIG. 15 illustrates the case where a 3-dimensional electromagnetic element array is constructed in which electromagnetic elements are buried within the bulk resonator. The electromagnetic elements are configured to maximize radiation in the top direction. In the illustrated example, radiation efficiency is 49.6% with gains of 5.6 dBi and −9.2 dBi in the top- and bottom direction respectively, demonstrating the directivity of the configuration.

Other Applications

The examples described above serve as illustrations for possible applications. The principle of using the third dimension for integrated electromagnetic elements can be extended to other applications. In particular, using analogues from traditional optics, a construction similar to that shown in FIG. 15 could also be used to form programmable quasi-optical elements such as but not limited to lenses, polarizers, mirrors, couplers and frequency-selective filters among others where there are both incoming and outgoing electromagnetic waves into and from the 3-dimensional programmable structure. In these applications, the 3-dimensional nature of the electromagnetic element array is used to manipulate an incoming wave to produce an outgoing wave (i.e. such as in lenses, polarizers, mirrors etc).

While the above description contains many specific embodiments of the invention, these should not be construed as limitations on the scope of the invention, but rather as an example of one embodiment thereof. Accordingly, the scope of the invention should be determined not by the embodiments illustrated, but by the appended claims and their equivalents.

What is claimed:

1. An integrated 3-dimensional electromagnetic element array, comprising:
    a first planar integrated circuit, where the first planar integrated circuit comprises at least a first integrated electromagnetic element; and
    at least a second planar integrated circuit located on a different plane to the first planar integrated circuit, where the second planar integrated circuit comprises at least a second integrated electromagnetic element;
    wherein the first and second integrated electromagnetic elements are configured to control the near- and far-field pattern produced by the 3-dimensional electromagnetic element array;
    wherein the bulk resonator comprises a die stack;
    wherein the first planar integrated circuit is located on a first semiconductor substrate within the die stack; and
    wherein the second planar integrated circuit is located on a second semiconductor substrate within the die stack.

2. The integrated 3-dimensional electromagnetic element array of claim 1, wherein:
    the first planar integrated circuit is formed on the surface of a bulk resonator; and
    the second planar integrated circuit is buried within the bulk resonator.

3. The integrated 3-dimensional electromagnetic element array of claim 2, further comprising:
    a plurality of planar integrated circuits buried at different depths within the bulk resonator, where each integrated circuit includes at least one integrated electromagnetic element;
    wherein the electromagnetic elements are configured to control the near- and far-field pattern produced by the 3-dimensional electromagnetic element array.

4. The integrated 3-dimensional electromagnetic element array of claim 1, wherein the electromagnetic elements are configured to control the modes excited within the bulk resonator.

5. The integrated 3-dimensional electromagnetic element array of claim 1, wherein the electromagnetic elements are configured to control the directionality of energy radiated by the bulk resonator.

6. The integrated 3-dimensional electromagnetic element array of claim 1, wherein the electromagnetic elements are configured as an antenna.

7. The integrated 3-dimensional electromagnetic element array of claim 1, wherein the antenna is a phased antenna array.

8. The integrated 3-dimensional electromagnetic element array of claim 1, wherein the electromagnetic elements form part of an electromagnetic reflector.

9. The integrated 3-dimensional electromagnetic element array of claim 1, wherein the electromagnetic elements form part of a shutter.

10. The integrated 3-dimensional electromagnetic element array of claim 1, wherein the electromagnetic elements form part of a pulsed source.

11. The integrated 3-dimensional electromagnetic element array of claim 10, wherein the pulsed source is configured so that the timing of switching between states is aligned with the delay in the 3-dimensional electromagnetic element array.

12. The integrated 3-dimensional electromagnetic element array of claim 1, wherein the electromagnetic elements are configured as a frequency selective filter.

13. The integrated 3-dimensional electromagnetic element array of claim 1, wherein:
the first planar integrated circuit is located on the surface of the die stack; and
the second integrated circuit is buried within the die stack.

14. The integrated 3-dimensional antenna of claim 13, wherein the electromagnetic elements are configured to control the directionality of the energy radiated by the bulk resonator.

15. The integrated 3-dimensional antenna of claim 13, wherein the 3-dimensional electromagnetic element array is configured as an antenna.

16. The integrated 3-dimensional antenna of claim 13, wherein the antenna is a phased antenna array.

17. The integrated 3-dimensional electromagnetic element array of claim 13, wherein the electromagnetic elements form part of an electromagnetic reflector.

18. The integrated 3-dimensional electromagnetic element array of claim 13, wherein the electromagnetic elements form part of a shutter.

19. The integrated 3-dimensional electromagnetic element array of claim 13, wherein the electromagnetic elements form part of a pulsed source.

20. The integrated 3-dimensional electromagnetic element array of claim 19, wherein the pulsed source is configured so that the timing of switching between states is aligned with the delay in the 3-dimensional electromagnetic element array.

21. The integrated 3-dimensional electromagnetic element array of claim 13, wherein the electromagnetic elements are configured as a frequency selective filter.

22. The integrated 3-dimensional electromagnetic element array of claim 13, wherein the electromagnetic elements are electronically reconfigurable.

23. The integrated 3-dimensional electromagnetic element array of claim 1, wherein the electromagnetic elements are electronically reconfigurable.

24. The integrated 3-dimensional electromagnetic element array of claim 1, wherein the die stack further comprises intermediate dielectric layers.

25. The integrated 3-dimensional electromagnetic element array of claim 1, wherein at least the first semiconductor region includes a region having different material properties to the region on which the first planar integrated circuit is formed.

26. The integrated 3-dimensional antenna of claim 1, further comprising semiconductor optics formed on the die stack.

27. The integrated 3-dimensional antenna of claim 1, wherein the electromagnetic elements are configured to control the modes excited within the die stack.

* * * * *